US011119592B2

(12) United States Patent
Lee et al.

(10) Patent No.: US 11,119,592 B2
(45) Date of Patent: Sep. 14, 2021

(54) DISPLAY APPARATUS WITH BLACK MATRIX

(71) Applicant: Samsung Display Co., Ltd., Yongin-si (KR)

(72) Inventors: Hyeonbum Lee, Hwaseong-si (KR); Jeongwon Kim, Seoul (KR); Kwangwoo Park, Hwaseong-si (KR); Junhyuk Woo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/263,399

(22) Filed: Jan. 31, 2019

(65) Prior Publication Data

US 2019/0243496 A1    Aug. 8, 2019

(30) Foreign Application Priority Data

Feb. 5, 2018    (KR) ........................ 10-2018-0014229

(51) Int. Cl.
    *G06F 3/041*      (2006.01)
    *H01L 27/32*      (2006.01)
    *H01L 51/52*      (2006.01)

(52) U.S. Cl.
    CPC .......... *G06F 3/0412* (2013.01); *H01L 27/323* (2013.01); *H01L 27/3262* (2013.01);
    (Continued)

(58) Field of Classification Search
    CPC ......... G06F 2203/04112; G06F 3/0412; G06F 3/0445; G06F 3/0446; H01L 27/323;
    (Continued)

(56) References Cited

U.S. PATENT DOCUMENTS

| 8,648,972 B2 | 2/2014 | Chen et al. |
| 8,866,170 B2 | 10/2014 | Moon et al. |

(Continued)

FOREIGN PATENT DOCUMENTS

| JP | 2014-142610 A | 8/2014 |
| JP | 6134236 B2 | 5/2017 |

(Continued)

OTHER PUBLICATIONS

Extended European Search Report for corresponding European Patent Application No. 18209510.9, dated Apr. 1, 2019, 8 pages.

(Continued)

*Primary Examiner* — Ram A Mistry
(74) *Attorney, Agent, or Firm* — Lewis Roca Rothgerber Christie LLP

(57) ABSTRACT

A display apparatus includes a display panel in which a display area to display an image and a non-display area adjacent to the display area are defined, and in which a central area and a peripheral area in a periphery of the central area are defined in the display area, a touch sensor on the display panel, the touch sensor including a touch electrode layer, and a black matrix on the display panel. The black matrix includes a first black matrix in the central area and a second black matrix in the peripheral area. The second black matrix is on layer of the display panel that is higher than the first black matrix.

20 Claims, 17 Drawing Sheets

(52) U.S. Cl.
CPC ...... *H01L 27/3265* (2013.01); *H01L 27/3272* (2013.01); *H01L 27/3276* (2013.01); *H01L 51/5256* (2013.01); *H01L 51/5284* (2013.01)

(58) Field of Classification Search
CPC ............. H01L 27/3262; H01L 27/3265; H01L 27/3272; H01L 27/3276; H01L 51/5256; H01L 51/5284
See application file for complete search history.

(56) References Cited

U.S. PATENT DOCUMENTS

| | | | |
|---|---|---|---|
| 9,356,087 | B1 | 5/2016 | Lee et al. |
| 9,502,485 | B2 | 11/2016 | Kim et al. |
| 9,536,930 | B2 | 1/2017 | Saasaki et al. |
| 9,673,263 | B2 | 6/2017 | Ono et al. |
| 10,490,610 | B2 | 11/2019 | Kim |
| 2013/0044074 | A1* | 2/2013 | Park .................. G02F 1/1362 345/174 |
| 2016/0322604 | A1 | 11/2016 | Ho et al. |
| 2016/0378224 | A1* | 12/2016 | Kwon .................. H01L 27/322 345/174 |
| 2017/0033170 | A1 | 2/2017 | Kim et al. |
| 2017/0278899 | A1 | 9/2017 | Yang et al. |
| 2017/0278900 | A1 | 9/2017 | Yang et al. |
| 2019/0165325 | A1 | 5/2019 | Lee et al. |

FOREIGN PATENT DOCUMENTS

| | | |
|---|---|---|
| KR | 10-2012-0089950 A | 8/2012 |
| KR | 10-2015-0051602 A | 5/2015 |
| KR | 10-2016-0071581 A | 6/2016 |
| KR | 10-2017-0076187 A | 7/2017 |
| KR | 10-2017-0088473 A | 8/2017 |
| KR | 10-2017-0093869 A | 8/2017 |
| KR | 10-1842585 B1 | 3/2018 |
| KR | 10-2019-0064709 A | 6/2019 |

OTHER PUBLICATIONS

U.S. Notice of Allowance dated Jan. 14, 2021, issued in U.S. Appl. No. 16/193,666 (10 pages).

\* cited by examiner

DISPLAY APPARATUS WITH BLACK MATRIX

CROSS-REFERENCE TO RELATED APPLICATIONS

Korean Patent Application No. 10-2018-0014229, filed on Feb. 5, 2018, in the Korean Intellectual Property Office, and entitled: "Display Apparatus," is incorporated by reference herein in its entirety.

BACKGROUND

1. Field

Embodiments relate to a display apparatus, and more particularly, to an organic light emitting display apparatus.

2. Description of the Related Art

Various display apparatuses, which are used in a multimedia device such as a television, a mobile phone, a tablet computer, a navigator, or a game player, are being developed. The display apparatus may be one of various display panels such as a liquid crystal display panel and organic light emitting display panel.

The optical characteristics of light emitted from the organic light emitting display panel may be defined in various ways and representatively as a viewing angle luminance ratio and a viewing angle chrominance. The viewing angle luminance ratio is a luminance of inclined emission light to a luminance of front emission light. In addition, the viewing angle chrominance may be defined as a color difference due to an optical path difference according to a viewing angle.

SUMMARY

Embodiments are directed to a display apparatus including a display panel in which a display area configured to display an image and a non-display area adjacent to the display area are defined, and in which a central area and a peripheral area in a periphery of the central area are defined in the display area, a touch sensor on the display panel, the touch sensor including a touch electrode layer, and a black matrix on the display panel. The black matrix includes a first black matrix in the central area and a second black in the peripheral area. The second black matrix is on layer of the display panel that is higher than the first black matrix.

The touch electrode layer may include a first touch electrode layer in the central area and a second touch electrode layer in the peripheral area. The first black matrix maybe under the first touch electrode layer. The second black matrix may be over the second touch electrode layer.

The touch electrode layer may include a first touch electrode layer in the central area and a second touch electrode layer in the peripheral area. The first touch electrode layer may include a first lower touch electrode layer and a first upper touch electrode layer on the first lower touch electrode layer. The second touch electrode layer may include a second lower touch electrode layer and a second upper touch electrode layer on the second lower touch electrode layer.

The first black matrix may be under the first lower touch electrode layer and the first upper touch electrode layer. The second black matrix may be over the second lower touch electrode layer and the second upper touch electrode layer.

The first black matrix may be under the first lower touch electrode layer and the first upper touch electrode layer. The second black matrix may be between the second lower touch electrode layer and the second upper touch electrode layer.

The first black matrix may be between the first lower touch electrode layer and the first upper touch electrode layer. The second black matrix is over the second lower touch electrode layer and the second upper touch electrode layer.

The display apparatus may include a polarization layer over the touch sensor and the black matrix.

The display panel may include a base layer, a display element on the base layer and in the display area, and configured to display the image, and an encapsulation layer that encapsulates the display element.

The display element may be provided in plurality. The black matrix may overlap an area between the plurality of display elements.

The encapsulation layer may include an encapsulation organic layer that covers the display area. The encapsulation organic layer may have a first thickness in the central area a second thickness thinner than the first thickness in the peripheral area.

The encapsulation organic layer may include an acryl-based monomer.

The peripheral area may be on a plane and may enclose the central area.

The peripheral area may include a first peripheral area and a second peripheral area in a periphery of the first peripheral area. The black matrix may further include a third black matrix in the second peripheral area. The second black matrix may be in the first peripheral area. The third black matrix may be on a higher layer than the second black matrix.

The touch electrode layer may include a first touch electrode layer in the central area, a second touch electrode layer in the first peripheral area, and a third touch electrode layer in the second peripheral area. The first touch electrode layer may include a first lower touch electrode layer and a first upper touch electrode layer on the first lower touch electrode layer. The second touch electrode layer may include a second lower touch electrode layer and a second upper touch electrode layer on the second lower touch electrode layer. The third touch electrode layer may include a third lower touch electrode layer and a third upper touch electrode layer on the third lower touch electrode layer.

The first black matrix may be under the first lower touch electrode layer and the first upper touch electrode layer. The second black matrix may be between the second lower touch electrode layer and the second upper touch electrode layer. The third black matrix may be over the third lower touch electrode layer and the third upper touch electrode layer.

Embodiments are also directed to a display apparatus including a display panel in which a display area configured to display an image and a non-display area adjacent to the display area are defined. A central area and a peripheral area in a periphery of the central area may be defined in the display area. The display apparatus further includes a touch sensor on the display panel, the touch sensor including a touch electrode layer and a black matrix on the display panel. The black matrix may include a first black matrix in the central area and a second black matrix in the peripheral area. The touch electrode layer may include a first touch electrode layer in the central area and a second touch electrode layer in the peripheral area. The first black matrix may be under the first touch electrode layer, and the second black matrix may be over the second touch electrode layer.

The display panel may include a base layer, a display element on the base layer and in the display area, the display element being configured to display the image, and an encapsulation layer including an encapsulation organic layer that encapsulates the display element and covers the display area. The encapsulation organic layer may have a first thickness in the central area, and a second thickness smaller than the first thickness in the peripheral area.

Embodiments are also directed to a display apparatus including a display panel in which a display area configured to display an image and a non-display area adjacent to the display area are defined, and in which a central area and a peripheral area in a periphery of the central area are defined in the display area, a touch sensor on the display panel, the touch sensor including a touch electrode layer, and a black matrix disposed on the display panel. The touch electrode layer includes a first touch electrode layer in the central area and a second touch electrode layer in the peripheral area. The first touch electrode layer is on an layer that is higher than the second touch electrode layer.

The first touch electrode layer may include a first lower touch electrode layer and a first upper touch electrode layer on the first lower touch electrode layer. The second touch electrode layer may include a second lower touch electrode layer and a second upper touch electrode layer on the second lower touch electrode layer. The first lower touch electrode layer may be on an upper layer than that of the second lower touch electrode layer.

The black matrix may include a first black matrix in the central area and a second black matrix in the peripheral area. The first lower touch electrode layer may be over the first black matrix, and the second touch electrode layer may be under the second black matrix.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
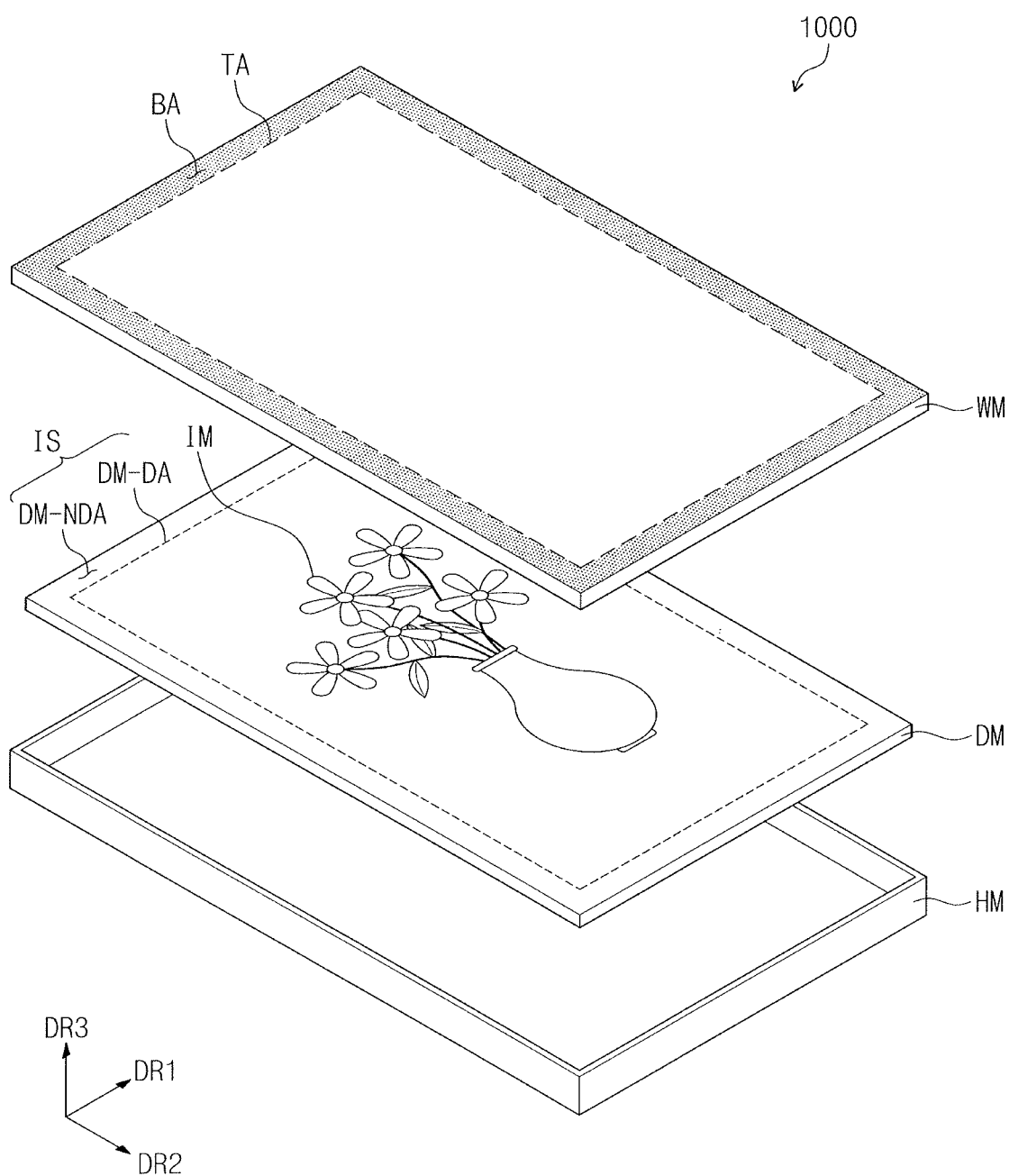
FIG. 1 illustrates a perspective view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present invention. The singular forms "a," "an" and "the" are intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Figure 2:
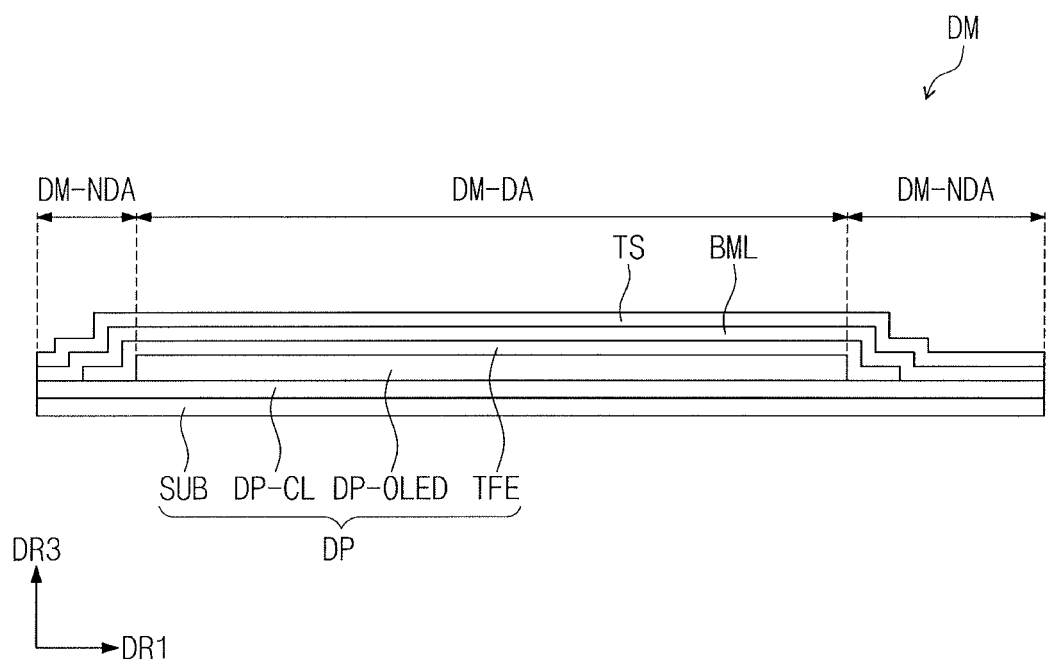
FIG. 2 illustrates a cross-sectional view of a display module according to an embodiment.

FIG. 1 illustrates a perspective view of a display apparatus 1000 according to an embodiment, and FIG. 2 illustrates a plan view of a display module DM of FIG. 1, The display apparatus 1000 in the embodiment may be applied not only to a large electronic device such as a television or a monitor, but also to a small or medium electronic device such as a tablet, a vehicle navigator, a game player, or a smart watch.

In relation to FIG. 1, the display apparatus 1000 may include the display modules DM, a window member WM, and a housing member HM.

A display surface IS on which an image IM is displayed in the display module DM may be parallel to a surface defined by a first directional axis DR1 and a second directional axis DR2. The normal direction of the display surface IS, namely, a thickness direction of the display module DM indicates a third directional axis DR3. A front surface (or top surface) and a rear surface (or bottom surface) of each member are distinguished by the third directional axis DR3. However, directions indicated by the first to third directional axis DR1, DR2, and DR3 are a relative concept and may be changed to other directions. Hereinafter, the first to third directions are directions respectively indicated by the first to third directional axes (DR1. DR2, and DR3) and will be referred by the same reference numerals.

In some implementations, the display module DM may be a flat rigid display module. In some implementations, the display module DM according to an embodiment may be flexible.

As illustrated in FIG. 1, the display module DM may include a display area DM-DA on which the image IM is displayed and a non-display area DM-NDA adjacent to the display area DM-DA. The non-display area DM-NDA is an area on which the image is not displayed. In FIG. 1, as an example of the image IM, a vase is illustrated. The shapes of the display area DM-DA and non-display area DM-NDA may be relatively designed. As an example, the display area DM-DA may have a rectangular shape, and the non-display area NDAO may enclose the display area DM-DA.

The window member WM may be disposed on the display module DM. The window member WM may protect the display module DM. The window member WM may be combined with the housing member HM to form an internal space. The window member WM and housing member HM may define the appearance of the display apparatus 1000.

The window member WM may be divided into a transmission area TA and a bezel area BA. The transmission area TA may transmit most of input light. The transmission area TA may have optical transparency. The transmission area TA may have an optical transmittance of about 90% or more. The transmission area TA may correspond to the display area DM-DA of the display module DM.

The bezel area BA may block most of input light. The bezel area BA may help prevent components disposed in a lower part of the window member WM from being viewed from the outside. The bezel area BA may also reduce reflection of light input from outside of the window member WM. The bezel area BA may correspond to the non-display area DM-NDA of the display module DM.

The bezel area BA may be adjacent to the transmission area TA. The shape of the transmission area TA on a planarized surface may be defined by the bezel area BA.

The housing member HM may provide a prescribed internal space. The display module DM may be accommodated in the internal space. Besides the display module DM, various electronic parts such as a power supply unit, a storage device, an acoustic input/output module, or a camera may be mounted in the internal space of the housing member HM.

FIG. 2 illustrates a cross-sectional view of the display module DM according to an embodiment. FIG. 2 illustrates a cross section defined by the first directional axis DR1 and the third directional axis DR3.

As illustrated in FIG. 2, the display module DM may include a display panel DP, a touch sensor TS (or touch sensing layer), and a black matrix layer BML. The display module DM according to an embodiment may further include a protection member disposed in the lower surface.

The display panel DP may be a light emitting type display panel As examples, the display panel DP may be an organic light emitting display panel or a quantum dot light emitting display panel. A light emitting layer of the organic light emitting display panel may include an organic light emitting material. A light emitting layer of the quantum dot light emitting display panel may include quantum dots and quantum rods. Hereinafter, the display panel DP will be described as the organic light emitting display panel.

The display panel DP may include a base layer SUB, a circuit element layer DP-CL disposed on the base layer SUB, a display element layer DP-OLED, and an encapsulation layer TFE. The display panel DP may further include functional layers such as a refractive index adjustment layer.

The base layer SUB may include at least one plastic film. The base layer SUB may include, a plastic substrate as a flexible substrate, a glass substrate, a metal substrate, or an organic/inorganic composite material substrate, etc. The display area DM-DA and non-display area DM-NDA described in relation to FIG. 1 may be identically defined for the base layer SUB.

The circuit element layer DP-CL may include at least one intermediate insulation layer and a circuit element. The intermediate insulation layer may include at least one intermediate inorganic layer and at least one intermediate organic layer. The circuit element may include signal lines and a driving circuit of a pixel, etc. A detailed description thereof will be as follows.

The display element layer DP-OLED may include organic light emitting diodes. The display element layer DP-OLED may further include an organic layer such as a pixel definition layer.

The encapsulation layer TFE may encapsulate the display element layer DP-OLED. The encapsulation layer TFE may include at least one inorganic layer (hereinafter, encapsulation inorganic layer). The encapsulation layer TFE may further include at least one organic layer (hereinafter, encapsulation organic layer). The encapsulation inorganic layer may help to protect the display element layer DP-OLED from moisture/oxygen, and the encapsulation organic layer may help to protect the display element layer DP-OLED from a foreign material such as a dust particle. The encapsulation inorganic layer may include a silicon nitride layer, a silicon oxynitride layer, and a silicon oxide layer, a titanium oxide layer, or an aluminum oxide layer, etc. The encapsulation organic layer may include an acrylic-based inorganic layer, as an example.

The touch sensor TS acquires coordinate information of an external input. The touch sensor TS may be disposed on the encapsulation layer TFE. The touch sensor TS may be directly disposed on the encapsulation layer TFE. Being "directly disposed" in the specification excludes being attached using a separate adhesive layer, and means being disposed by a continuous process. However, the inventive concept is not limited thereto, and the touch sensor TS may be attached onto the encapsulation layer TFE using a bonding layer.

The touch sensor TS may have a multi-layered structure. The touch sensor TS may include a conductive layer of a single layer or multiple layers. The touch sensor TS may include an insulation layer having a single layer or having multiple layers.

The touch sensor IS may have a suitable operational manner. The touch sensor TS may sense an external input in, for example, a capacitive manner. In some implementations, the touch sensor IS may sense an external input in a electromagnetic inductive manner or pressure sensing manner.

The black matrix layer BML may be disposed on the encapsulation layer TFE. The black matrix layer BML may include a plurality of black matrices. The black matrix may enhance a sense of color and may absorb external light to prevent reflection in the periphery.

The black matrix may be disposed under the touch electrode layer of the touch sensor TS in a part of the display module DM. The black matrix may be disposed over the touch electrode layer of the touch sensor TS in another part of the display module DM. A detailed description thereof will be provided below.

Figure 3:
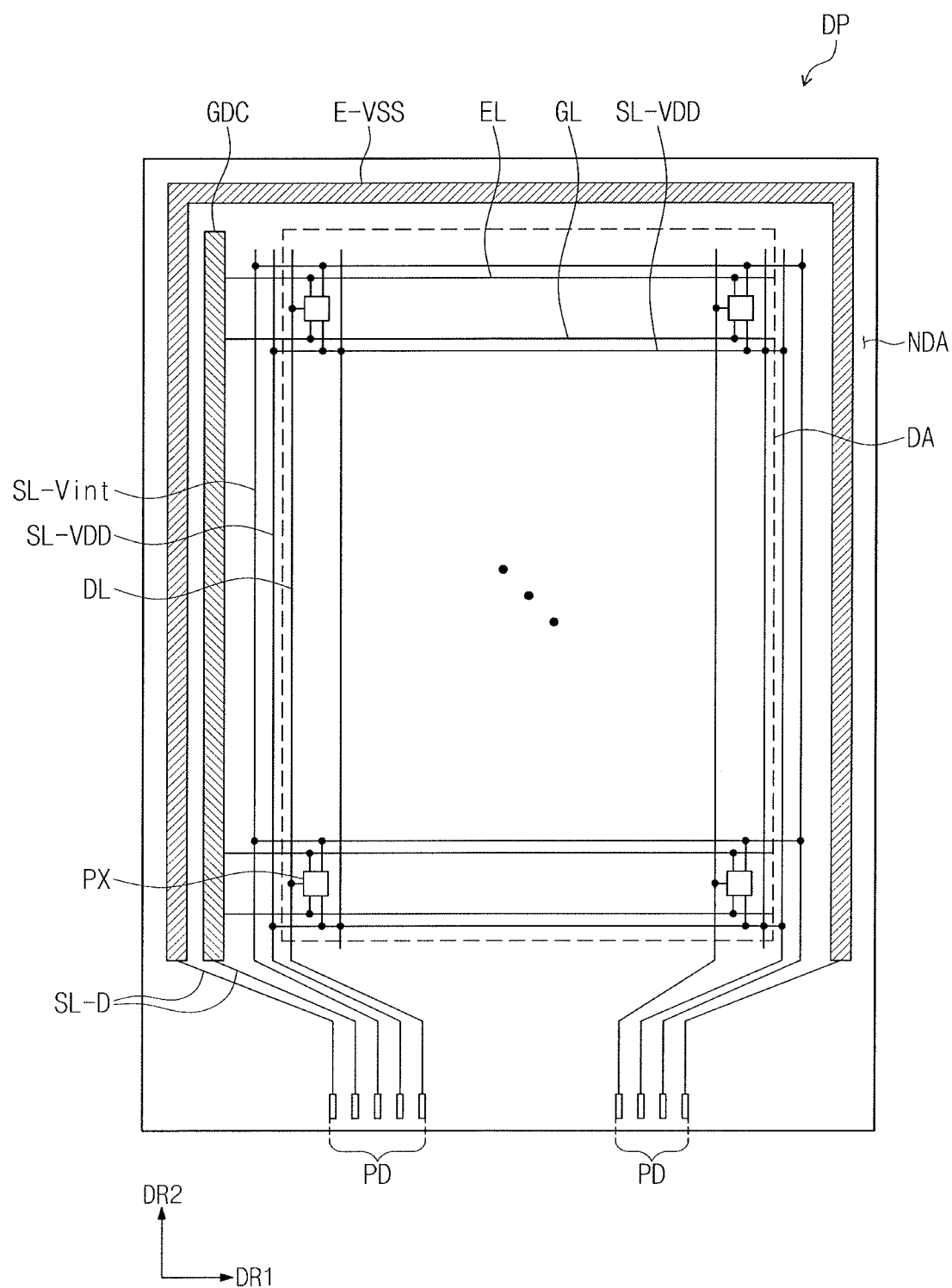
FIG. 3 illustrates a plane view of a display panel according to an embodiment.
Figure 4:
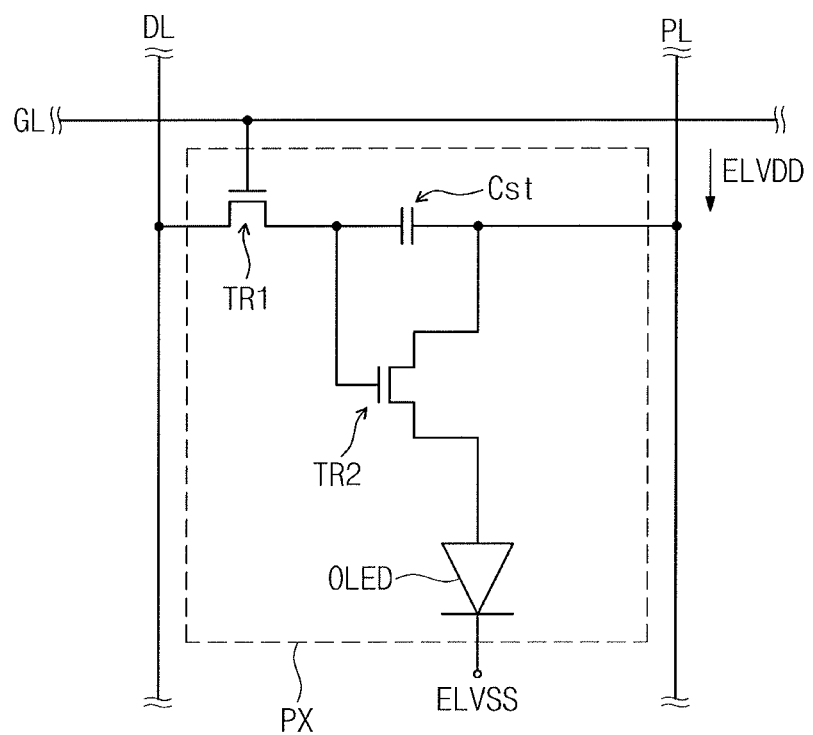
FIG. 4 illustrates an equivalent circuit diagram of a pixel according to an embodiment.
Figure 5:
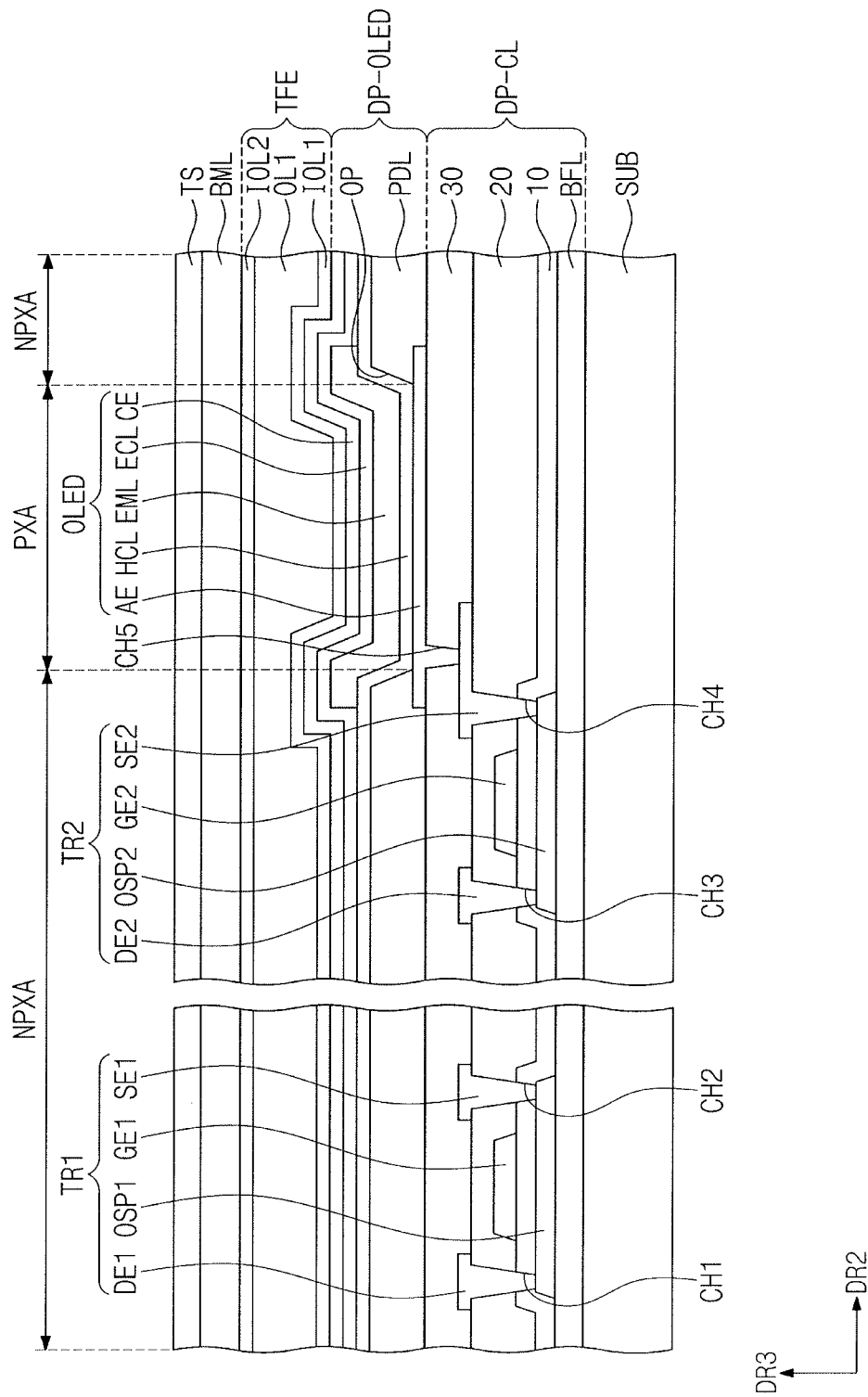
FIG. 5 illustrates an enlarged cross-sectional view of the display panel according to an embodiment.

FIG. 3 illustrates a plan view of the display panel DP according to an embodiment. FIG. 4 illustrates an equivalent circuit diagram of a pixel PX according to an embodiment. FIG. 5 illustrates an enlarged cross-sectional view of the display panel DP according to an embodiment.

As illustrated in FIG. 3, the display panel DP may include the display area DA and the non-display area NDA on the planarized surface. The non-display area NDA in the embodiment may be defined according to the bezel of the display area DA. The display area DA and the non-display area NDA of the display panel DP may respectively correspond to the display area DM-DA and the non-display area DM-NDA of the display module DM illustrated in FIG. 1. The display area DA and the non-display area NDA of the display panel DP may not necessarily identical to the display area DM-DA and the non-display area DM-NDA of the display module DM, and may be modified according to the structure/design of the display panel DP.

The display panel DP includes a plurality of pixels. The plurality of pixels may be disposed in the display area DA. Each of the pixels PX may include an inorganic light emitting diode and a pixel driving circuit connected thereto.

The display panel DP may include a plurality of signal lines and a pad unit PD. The plurality of signal lines may include gate lines GL, data lines DL, light emission lines EL, a control signal line SL-D, an initialization voltage line SL-Vint, a voltage line SL-VDD, and a power supply line E-VSS. The plurality of signal lines and the pad unit PD may be included in the circuit element layer DP-CL illustrated in FIG. 2.

A part of the gate lines GL, the data lines DL, the light emission lines EL, the control signal line SL-D, the initialization voltage line SL-Vint, the voltage line SL-VDD, and the power supply line E-VSS may be disposed on a same layer and another part thereof may be disposed on different layers.

The gate lines GL may be respectively connected to corresponding pixels PX from among the plurality number of pixels PX. The data lines DL may be respectively connected to corresponding pixels PX from among the plurality number of pixels PX. The light emission lines EL may be respectively arranged in parallel to the corresponding gate lines from among the plurality of gate lines GL. The control signal line SL-D may provide control signals to a gate driving circuit GDC. The initialization voltage line SL-Vint may provide an initialization voltage to the plurality of pixels PX. The voltage line SL-VDD may be connected to the plurality of pixels PX, and provide a first voltage thereto. The voltage line SL-VDD may include a plurality of lines extending in the first direction DR1 and a plurality of lines extending in the second direction DR2. The power supply line E-VSS may be disposed to enclose three sides of the display area DA in the non-display area NDA. The power supply line E-VSS may provide a common voltage (e.g. a second voltage) to the plurality of pixels PX. The common voltage may have a lower level than the first voltage.

The display panel DP may further include the gate driving circuit GDC. The gate driving circuit GDC may be disposed at one side of the non-display area NDA to be connected to the gate lines GL and the light emission lines EL. The gate driving circuit GDC may be included in the circuit element layer DP-CL illustrated in FIG. 2. The gate driving circuit GDC may include a plurality of thin-film transistors formed through a same process as that of the driving circuit of the plurality of pixels, for example, a Low Temperature Polycrystalline Silicon (LTPS) process or a Low Temperature Polycrystalline Oxide (LTPO) process.

The pad unit PD may include a plurality of pads. A part of the pad unit PD may be connected to the terminals of the data lines DL, control signal line SL-D, initialization voltage line SL-Vint, and voltage line SL-VDD. The other part of the pad PD may be connected to touch signal lines of the touch sensor unit TS.

The display panel DP may further include a bank disposed between the display area DA and the pad unit PD. The display panel DP may further include a dam unit enclosing the bezel of the display area DA. The bank and the dam unit may help to prevent a specific layer from overflowing outside the bank or dam unit, when the specific layer is formed by printing at the time of forming the display panel DP.

FIG. 4 exemplarily illustrates a pixel PX connected to any one gate line GL, any one data line DL and a power line PL. The configuration of the pixel PX may be modified.

The organic light emitting diode OLED may be a front light emitting type diode or rear light emitting type diode. The pixel PX may include a first transistor TR1 (or switching transistor), a second transistor TR2 (or driving transistor), and a capacitor Cst as a pixel driving circuit for driving the organic light emitting diode OLED. A first power supply voltage ELVDD may be provided to the second transistor TR2, and a second power supply voltage ELVSS may be provided to the organic light emitting diode OLED. The second power supply voltage ELVSS may be lower than the first power supply voltage ELVDD.

The first transistor may output a data signal to be applied to the data line in response to a scan signal applied to the gate line GL. The capacitor Cst may charge a voltage corresponding to the data signal received from the first transistor TR1.

The second transistor TR2 may be connected to the organic light emitting diode OLED. The second transistor TR2 may control a driving current flowing through the organic light emitting diode OLED in correspondence to a charge amount stored in the capacitor Cst. The organic light emitting diode OLED may emit light during a turn-on period of the second transistor TR2.

FIG. 5 illustrates a partial cross-section of the display panel DP in correspondence to the equivalent circuit illustrated in FIG. 4. As shown in FIG. 5, a circuit element layer DP-CL, a display element layer DP-OLED, and the encapsulation layer TFE may be sequentially disposed on the base layer SUB.

The circuit element layer DP-CL may include at least one inorganic layer, at least one organic layer and a circuit element. The circuit element layer DP-CL may include a buffer layer BFL that is an inorganic layer, a first intermediate inorganic layer 10 and a second intermediate inorganic layer 20, and an intermediate organic layer 30 that is an organic layer.

The inorganic layers may include silicon nitride, silicon oxynitride, and silicon oxide, etc. The organic layer may include at least one among an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-base resin and a perylene-based resin. The circuit element may include conductive patterns and/or semiconductor patterns.

The buffer layer BFL may improve coherence between the base layer SUB and the conductive patterns or semiconductor patterns. Although not shown separately, a barrier layer configured to prevent an influx of a foreign material may be further disposed on the top surface of the base layer SUB. The buffer layer BFL and the barrier layer may be selectively disposed or omitted.

A semiconductor pattern OSP1 (hereinafter, first semiconductor pattern) of the first transistor TR1 and a semiconductor pattern OSP2 (hereinafter, second semiconductor pattern) of the second transistor TR2 may be disposed on the buffer layer BFL. The first semiconductor pattern OSP1 and the second semiconductor pattern OSP2 may be selected from among amorphous silicon, polysilicon and metal oxide semiconductor.

The first intermediate inorganic layer 10 may be disposed on the first semiconductor pattern OSP1 and second semiconductor pattern OSP2. A control electrode GE1 (hereinafter, first control electrode) of the first transistor TR1 and a control electrode GE2 (hereinafter, second control electrode) of the second transistor TR2 may be disposed on the first intermediate inorganic layer 10. The first control electrode GE1 and second control electrode GE2 may be manufactured according to a same photography process as that of the gate lines GL.

A second intermediate inorganic layer 20 configured to cover the first control electrode GE1 and the second control electrode GE2 may be disposed on the first intermediate inorganic layer 10. An input electrode DE1 (hereinafter, first input electrode) and output electrode SE1 (hereinafter, first output electrode) of the first transistor TR1, and an input electrode DE2 (hereinafter, second input electrode) and output electrode SE2 (hereinafter, second output electrode) of the second transistor TR2 may be disposed on the second intermediate inorganic layer 20.

The first input electrode DE1 and the output electrode SE1 may be respectively connected to the first semiconductor pattern OSP1 through a first through-hole CH1 and a second through-hole CH2, which pass through the first intermediate inorganic layer 10 and the second intermediate inorganic layer 20. The second input electrode DE2 and the output electrode SE2 may be respectively connected to the second semiconductor pattern OSP2 through a third through-hole CH3 and fourth through-hole CH4, which pass through the first intermediate inorganic layer 10 and the second intermediate inorganic layer 20. In some implementations, the first transistor TR1 and second transistor TR2 may be modified and implemented in a bottom-gate structure.

The intermediate organic layer 30 configured to cover the first input electrode DE1, the second input electrode DE2, the first output electrode SE1, and the second output electrode SE2 may be disposed on the second intermediate inorganic layer 20. The intermediate organic layer may provide a planarized surface.

The display element layer DP-OLED may be disposed on the intermediate organic layer 30. The display element layer DP-OLED may include a pixel definition layer PDL and an organic light emitting diode OLED. Like the intermediate organic layer 30, the pixel definition layer PDL may include an organic material. A first electrode AE may be disposed on the intermediate organic layer 30. The first electrode AE may be connected to the second output electrode SE2 through a fifth through-hole CH5 configured to penetrate through the intermediate organic layer 30. An opening part OP may be defined in the pixel definition layer PDL. The opening part OP of the pixel definition layer PDL may expose at least a part of the first electrode AE.

The pixel PX may be disposed on a pixel area on a planarized surface. The pixel area may include a light emitting area PXA and a non-light emission area NPXA adjacent to the light emission area PXA. The non-light emission area NPXA may enclose the light emission area PXA. The light emission area PXA in the embodiment may be defined to correspond to a partial area of the first electrode AE that is exposed by the opening unit OP.

A hole control layer HCL may be commonly disposed in the light emission area PXA and non-light emission area NPXA. A common layer such as the hole control layer HCL may be commonly formed in the plurality of pixels PX (see FIG. 3).

A light emission layer EML may be disposed on the hole control layer HCL. The light emission layer EML may be disposed on an area corresponding to the opening part OP. The light emission layer EML may be separately formed in each of the plurality of pixels PX. The light emission layer EML may include an organic material and/or an inorganic material. In the embodiment, the patterned light emission layer EML is exemplarily illustrated. In some implementations, the light emission layer EML may be commonly disposed in the plurality of pixels PX. Here, the light emission layer EML may generate red, green, blue, or white light, as examples. The light emission layer EML may have a multi-layered structure.

An electron control layer ECL may be disposed on the light emission layer EML. The electron control layer ECL may be commonly formed on the plurality of pixels PX (see FIG. 3).

A second electrode CE may be disposed on the electron control layer ECL. The second electrode CE may be commonly disposed in the plurality of pixels PX.

The encapsulation layer TFE may be disposed on the second electrode CE. The encapsulation layer TFE may be commonly disposed in the plurality of pixels PX. The encapsulation layer TFE may directly cover the second electrode CE.

The encapsulation layer TFE may include at least one encapsulation inorganic layer and at least one encapsulation organic layer. The encapsulation inorganic layer and encapsulation organic layer may be alternately laminated.

In an embodiment, it is exemplarily illustrated that the encapsulation layer TFE includes first and second encapsulation inorganic layers IOL1 and OIL2, and a first encapsulation organic layer OL1.

The first encapsulation inorganic layer IOL1, the first encapsulation organic layer OL1, and the second encapsulation inorganic layer IOL2 may be sequentially laminated on the second electrode CE.

The first encapsulation organic layer OL1 may be formed using an ink-jet printing scheme, or formed by coating a composition including an acryl-based monomer. The first and second encapsulation inorganic layers IOL1 and IOL2 may have an identical inorganic material or different inorganic materials. Materials forming the first and second encapsulation inorganic layers IOL1 and IOL2 may include, for example, silicon nitride, silicon oxynitride, and silicon oxide, etc.

In an embodiment, a capping layer covering the second electrode CE may be further disposed between the encapsulation layer TFE and the second electrode CE. The encapsulation layer TFE may directly cover the capping layer.

Figure 6:
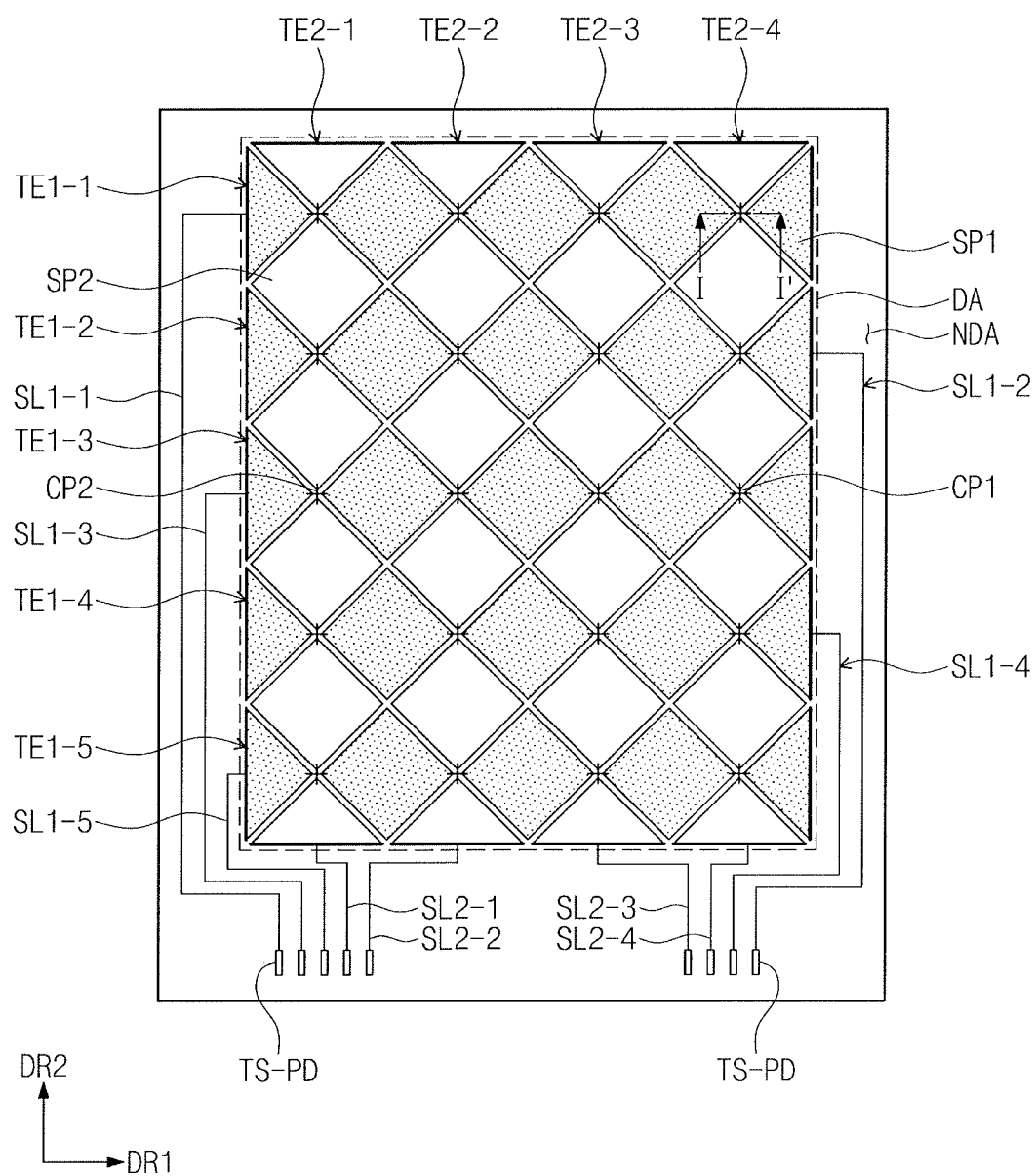
FIG. 6 illustrates a plan view illustrating a touch panel of FIG. 2.
Figure 7:
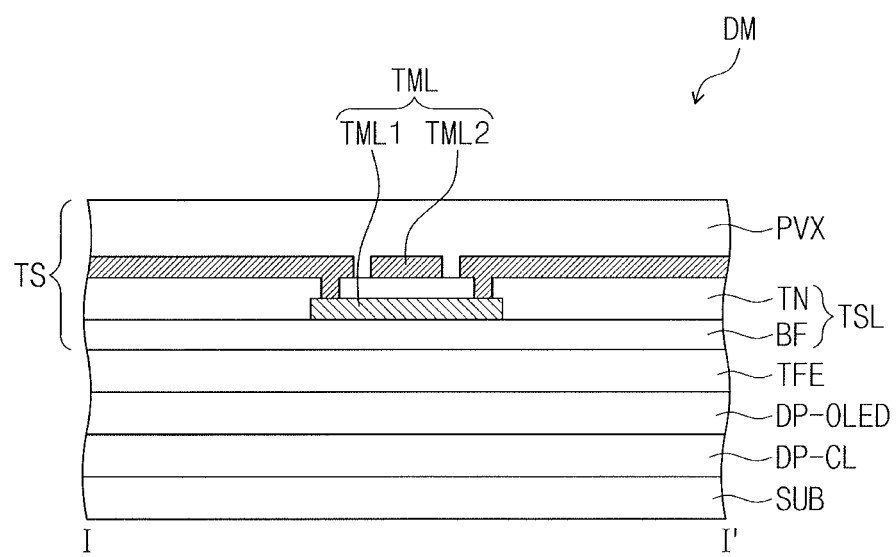
FIG. 7 illustrates a cross-sectional view cut along a line I-I' of FIG. 6.

FIG. 6 illustrates a plan view depicting the touch sensor of FIG. 2, and FIG. 7 illustrates a cross-sectional view cut along a line I-I' of FIG. 6.

In relation to FIGS. 6 and 7, the touch sensor TS may include a touch electrode layer TML and a touch insulation layer TSL. The touch insulation layer TSL may contact the touch electrode layer TML.

The touch electrode layer TML may include a lower touch electrode layer TML1 and an upper touch electrode layer TML2. The touch insulation layer TSL may include a buffer layer BF and a contact insulation layer TN.

The upper touch electrode TML2 may be disposed on the lower touch electrode layer TML1.

Each of the lower touch electrode layer TML1 and the upper touch electrode layer TML2 may have a single-layered structure or a laminated multi-layered structure. A conductive layer of the multi-layered structure may include at least two among transparent conductive layers and metal layers. The conductive layer of the multi-layered structure may include metal layers including different metals. The transparent conductive layer may include indium tin oxide (ITO), indium zinc oxide (IZO), zinc oxide (Zn0), indium tin zinc oxide (ITZO), PEDOT, a metal nanowire, or graphene. The metal layer may include molybdenum, silver, titanium, copper, aluminum, and an alloy thereof. For example, each of the lower touch electrode layer TML1 and the upper touch electrode layer TML2 may have a three-layered structure of titanium/aluminum/titanium.

The contact insulation layer TN may be disposed between the lower touch electrode layer TML1 and the upper touch electrode layer TML2. The buffer layer BF may be disposed between the encapsulation layer TFE and the lower touch electrode layer TML1. In some implementations, the buffer layer BF may be omitted.

The buffer layer BF and the contact insulation layer TN may include an inorganic material. The inorganic material may include silicon nitride, silicon oxynitride and silicon oxide, etc.

The touch sensor TS may further include a first planarized layer PVX disposed over the upper touch electrode layer TML2. The first planarized layer PVX may provide a planarized surface and may include an organic material. The touch sensor TS may further include a second planarized layer disposed on the first planarized layer PVX.

As illustrated in FIG. 6, the touch sensor TS may include first touch electrodes TE1-1 to TE1-4, first touch signal lines SL1-1 to SL1-5 connected to the first touch electrodes TE1-1 to TE1-4, second touch electrodes TE2-1 to TE2-5, second touch signal lines SL2-1 to SL2-4 connected to the second touch electrodes TE2-1 to TE2-5, and touch pads TS-PD connected to the first touch signal lines SL1-1 to SL1-5 and the second touch signal lines SL2-1 to SL2-4.

Each of the first touch electrodes TE1-1 to TE1-4 may have a mesh shape in which a plurality of touch opening parts are defined. Although not illustrated in detail, the first touch electrodes TE1-1 to TE1-4 may be covered on the plane with the pixel definition layer (PDL) that has been described in relation to FIG. 5. Each of the first touch electrodes TE1-1 to TE1-4 may include a plurality of first touch sensor units SP1 and a plurality of first connection parts CP1. The first touch sensor units SP1 may be arranged along a first direction DR1. Each of the first connection parts CP1 may connect two adjacent first touch sensors SP1 from among the first touch sensors SP1. The first touch signal lines SL1-1 to SL1-5 may also have a mesh shape.

The second touch electrodes TE2-1 to TE2-4 may be cross-insulated from the first touch electrodes TE1-1 to TE1-4. Each of the second touch electrodes TE2-1 to TE2-4 may have a mesh shape in which a plurality of touch opening parts are defined. The second touch electrodes TE2-1 to TE2-4 may be covered on the plane with the pixel definition layer (PDL) that has been described in relation to FIG. 5. Each of the first touch electrodes TE2-1 to TE2-4 may include a plurality of second touch sensors SP2 and a plurality of second connection parts CP2. The second touch sensors SP2 may be arranged along a second direction DR2. Each of the second connection parts CP2 may connect two adjacent second touch sensors SP2 from among the second touch sensors SP2. The second touch signal lines SL2-1 to SL2-4 may also have a mesh shape.

The first touch electrodes TE1-1 to TE1-5 and the second touch electrodes TE2-1 to TE2-4 may be electrostatically coupled. As the touch sensing signals are applied to the first touch electrodes TE1-1 to TE1-5, capacitors may be formed between the first touch sensors SP1 and the second touch sensors SP2.

The embodiment exemplarily illustrates that the plurality of first connection parts CP1 are formed from the lower touch electrode layer TML1, and the plurality of first touch sensors SP1 and the plurality of second connection parts CP2 are formed from the upper touch electrode layer TML2.

In some implementations, part of the plurality of first touch sensors SP1, the plurality of first connection parts CP1, the first touch signal lines SL1-1 to SL1-5, the plurality of second touch sensors SP2, the plurality of second connection parts CP2, and the second touch signal lines SL2-1 to SL2-4 may be formed from the lower touch electrode layer TML1 illustrated in FIG. 7, and the other part may be formed from the upper touch electrode layer TML2 illustrated in FIG. 7.

Figure 8:
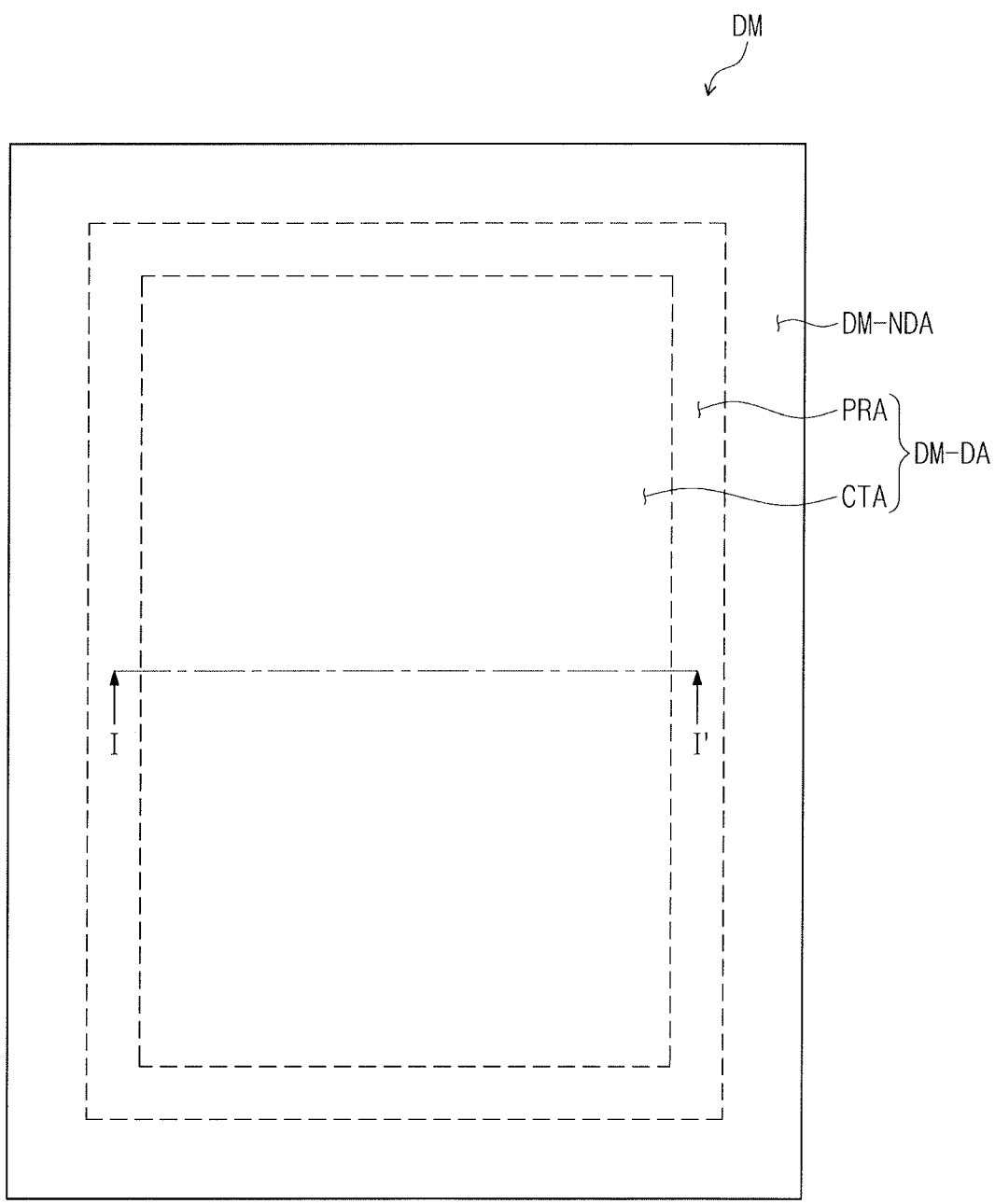
FIG. 8 illustrates a plan view depicting a display module according to an embodiment.
Figure 9:
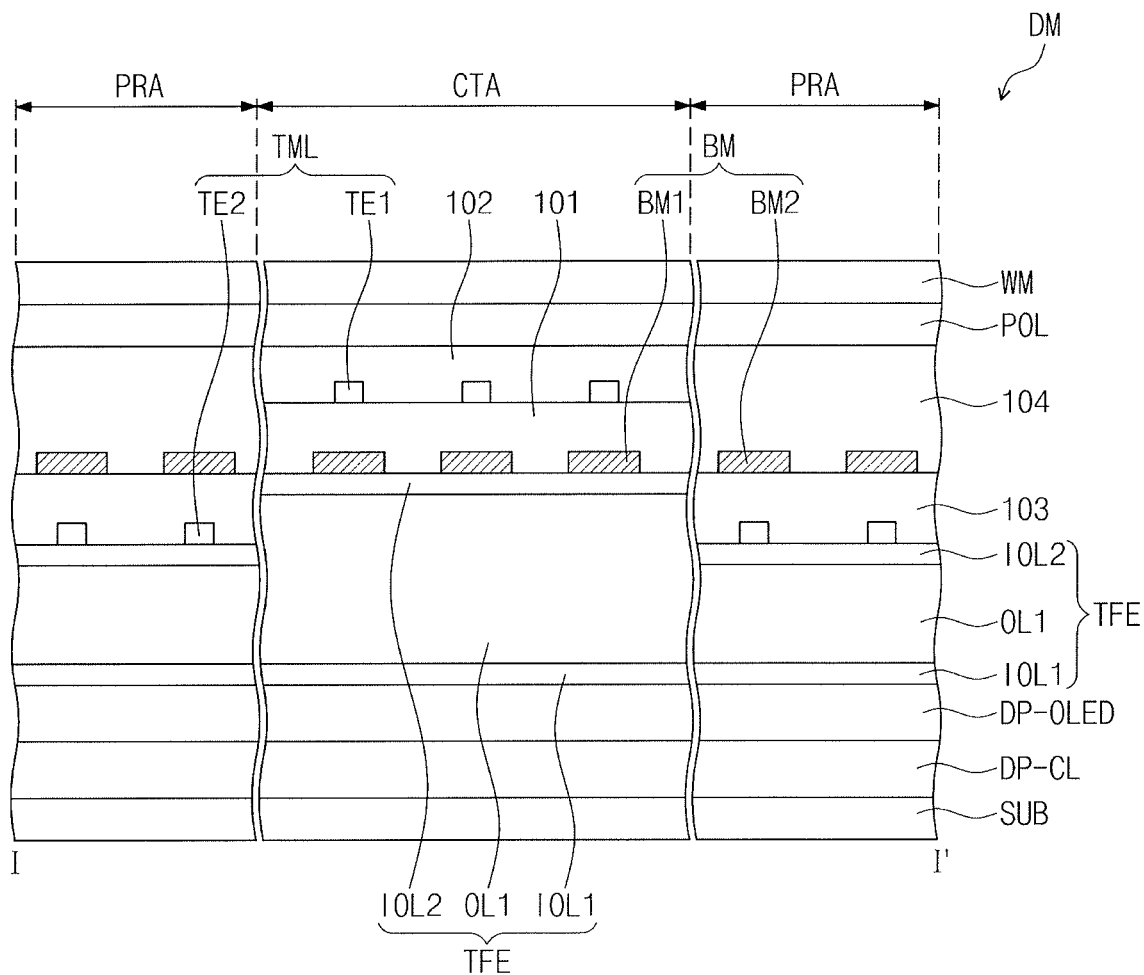
FIG. 9 illustrates a cross-sectional view cut along a line I-I' of FIG. 8.
Figure 10:
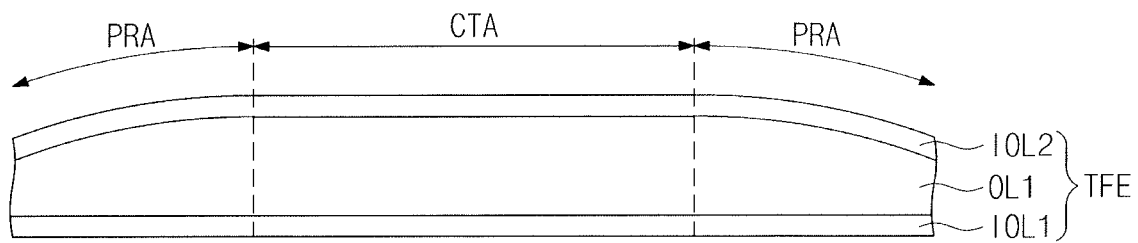
FIG. 10 illustrates a cross-sectional view depicting an encapsulation layer taken along a line I-I' of FIG. 8.

FIG. 8 illustrates a plan view depicting the display module according to an embodiment, FIG. 9 illustrates a cross-sectional view cut along line I-I' of FIG. 8, and FIG. 10 illustrates a cross-sectional view depicting the encapsulation layer along the line I-I' of FIG. 8.

In relation to FIGS. 8 to 10, the display area DM-DA and the non-display area DM-NDA may be defined in the display module DM. Detailed descriptions regarding the display area DM-DA and non-display area DM-NDA have been provided in relation to FIG. 1 and thus will not be repeated.

A central area CTA and a peripheral area PRA may be defined in the display area DM-DA. The peripheral area PRA may be defined in the periphery of the central area CTA. In an embodiment, the peripheral area PRA on the plane is illustrated as an area enclosing the central area CTA. In some implementations, the peripheral area PRA may not enclose the central area CIA, but may be defined in the periphery of the central area CTA.

The first and second encapsulation inorganic layers IOL1 and IOL2 and the first encapsulation organic layer OL1 of the encapsulation layer TFE may be disposed to cover the display area DM-DA.

In a process for forming the first encapsulation organic layer OL1, an organic material may flow down in the peripheral area PRA due to a reflow phenomenon of the organic material. In the central area CTA, the thickness of the first encapsulation organic layer OL1 may be larger than that of the peripheral area PRA.

The central area CTA and the peripheral area PRA may be defined by a difference in thickness of the first encapsulation organic layer OL1. In the central area CTA, the thickness of the first encapsulation organic layer OL1 may be substantially identical. The thickness of the first encapsulation organic layer OL1 disposed in the peripheral area PRA may be smaller by at least a preset value than that of the first encapsulation organic layer OL1 disposed in the central area CTA. The preset value may be, for example, 1 μm.

The black matrix BM may include a first black matrix BM1 and a second black matrix BM2. The black matrix BM may improve a color sense of a displayed image and may absorb external light to prevent reflection in a periphery.

The first black matrix BM1 may be disposed in the central area CTA, and the second black BM2 may be disposed in the peripheral area PRA. The first and second black matrixes BM1 and BM2 may include an inorganic material as a base material. The first and second black matrixes BM1 and BM2 may include a black pigment or black dye. The first and second black matrixes BM1 and BM2 may be formed from an identical material.

The touch electrode layer TML may include a first touch electrode layer TE1 and a second touch electrode layer TE2.

The first touch electrode layer TE1 may be disposed in the central area CIA, and the second touch electrode layer TE2 may be disposed in the peripheral area PRA. As illustrated in FIG. 9, each of the first touch electrode layer TE1 and the second touch electrode layer TE2 may have a configuration that includes all of the lower touch electrode layer TML1 and the upper touch electrode layer TML2, as were described above in relation to FIG. 7. In some implementations, each of the first touch electrode layer TE1 and the second touch electrode layer TE2 may have a configuration referring to any one layer between the lower touch electrode layer TML1 and the upper touch electrode layer TML2.

The second black matrix BM2 may be disposed on an upper layer in comparison to the first black matrix BM1. The first touch electrode layer TE1 may be disposed on upper layer higher than the second touch electrode layer TE2.

In an embodiment, the first black matrix BM1 may be disposed under the first touch electrode layer TE1, and the second black matrix BM2 may be disposed over the second touch electrode layer TE2.

The display module DM may include first to fourth insulation layers 101 to 104.

The first insulation layer 101 and the second insulation layer 102 may be disposed in the central area CTA. The first insulation layer 101 may be disposed over the first black matrix BM1 to cover the first black matrix BM1. The second insulation layer 102 may be disposed over the first touch electrode layer TE1 to cover the first touch electrode layer TE1.

The third insulation layer 103 and the fourth insulation layer 104 may be disposed in the peripheral area PRA. The third insulation layer 103 may be disposed over the second touch electrode TE2 to cover the second touch electrode layer TE2. The fourth insulation layer 104 may be disposed on the second black matrix BM2 to cover the second black matrix BM2.

Each of the first to fourth insulation layers 101 to 104 may be in a form of an organic single layer, an inorganic single layer, or a multi-layered structure including an organic layer and an inorganic layer. At least a part of the first to fourth insulation layers 101 to 104 may have different layered structures. Detailed layered structures of the first to fourth insulation layers 101 to 104 will be described in detail in reference to FIGS. 11 to 16.

The display module DM may further include a polarization layer POL. The polarization layer POL may be disposed on the first and second black matrices BM1 and BM2, and on the first and second touch electrode layers TE1 and TE2. The polarization layer POL may help to prevent the reflection of external light. The polarization layer POL may include a quarter-wave plate. A window member WM may be disposed on the polarization layer POL.

A viewing angle luminance ratio may be defined as the luminance of projected light at an inclination angle (e.g. 45°) to the luminance of front projection light (0°). A viewing angle chrominance may be defined as a color difference due to an optical path difference according to a viewing angle. The optical characteristics may be defined to be excellent when the viewing angle luminance ratio is lower, or when the viewing angle chrominance is higher.

There may be a difference in optical characteristics according to the difference in thickness of the first encapsulation organic layer OL1 in the central area CTA and in the the peripheral area PRA of the display module DM. The optical characteristics may be relatively excellent in the peripheral area PRA in which the thickness of the first encapsulation organic layer OL1 is relatively small. The optical characteristics may be not as good in the central area CTA in which the thickness of the first encapsulation organic layer OL1 is relatively large.

In addition, the optical characteristics of light projected from the display module DM may differ according to the distance between the black matrix BM and an organic light emitting diode. When the distance between the black matrix BM and the organic light emitting diode is relatively small, the optical characteristics may be relatively excellent. When the distance between the black matrix BM and the organic light emitting diode is relatively large, the optical characteristics may not be as good.

In an embodiment, a difference in optical characteristics of the display module DM due to the difference in thickness of the first encapsulation organic layer OL1 in the central area CTA and the peripheral area PRA may be compensated for by changing the positions of the black matrix BM and the touch electrode layer TE in the central area CTA and the peripheral area PRA. Accordingly, display quality of the display module DM may be improved. In detail, the thickness of the first encapsulation organic layer OL1 in the central area CTA may be relatively larger than the thickness in the peripheral area PRA. Thus, the first black matrix BM1 may be disposed under the first touch electrode layer TE1 to relatively reduce the distance between the first black matrix BM and the organic light emitting diode. The thickness of the first encapsulation layer OL1 in the peripheral area PRA may be relatively smaller than that in the central area CIA. The second black matrix BM2 may be disposed over the second touch electrode layer TE2 to relatively increase the distance between the second black matrix BM2 and the organic light emitting diode. In the display apparatus according to an embodiment, the optical characteristics of the display module DM may be uniform in the central area CTA and peripheral area PRA.

Figure 11:
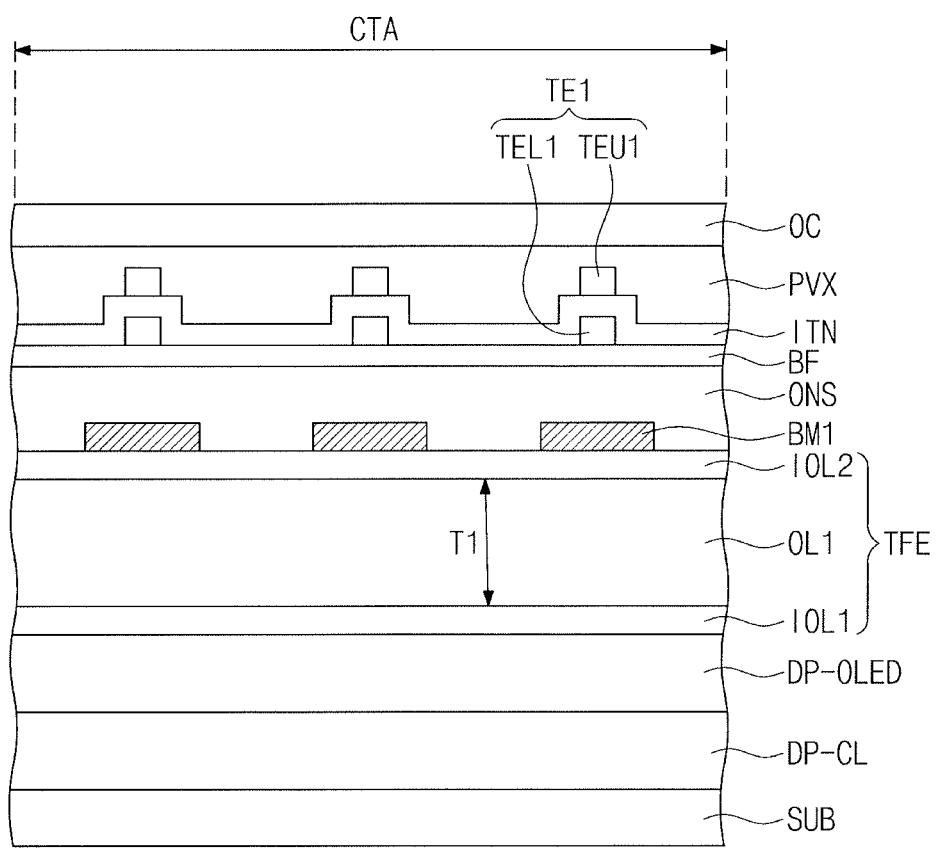
FIG. 11 illustrates a cross-sectional view of a display module corresponding to a central area of FIG. 8 in an embodiment.
Figure 12:
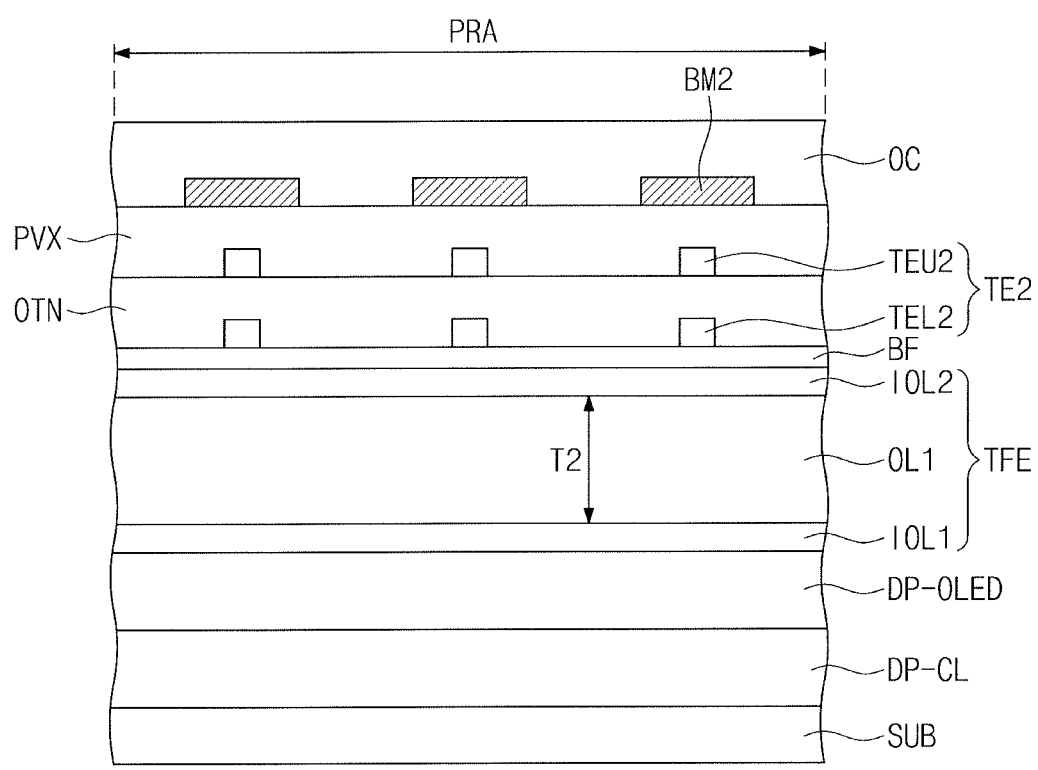
FIG. 12 illustrates a cross-sectional view of a display module corresponding to a peripheral area of FIG. 8 in an embodiment.

FIG. 11 illustrates a cross-sectional view of the display module corresponding to the central area of FIG. 8 in an embodiment, and FIG. 12 illustrates a cross-sectional view of the display module corresponding to the peripheral area of FIG. 8.

FIGS. 11 and 12 illustrate, for convenience, the display module DM with the polarization layer POL and the window member WM omitted.

The first and second black matrixes BM1 and BM2 may be disposed to overlap the non-light emission area NPXA having been described in relation to FIG. 5. On the plane, the first touch electrode layer TE1 may cover the first black matrix BM1, and the second touch electrode layer TE2 may be covered with the second black matrix BM2.

Referring to FIGS. 11 and 12, the first encapsulation layer OL1 may have the first thickness T1 in the central area CTA and the second thickness T2, which is smaller than the first thickness T1, in the peripheral area PRA. The thickness of the first encapsulation layer OL1 in the peripheral area PRA may not be constant but may be different according to the position. The average thickness of the first encapsulation organic layer OL1 in the peripheral area PRA may be the second thickness T2.

The first black matrix BM1 may be disposed on and contact the second encapsulation inorganic layer IOL2. A black matrix insulation layer ONS may be disposed over the first black matrix BM1. The black matrix insulation layer ONS may cover the first black matrix BM1. In an embodiment, the black matrix insulation layer ONS may be disposed to overlap the central area CTA and not to overlap the peripheral area PRA. In some implementations, the black matrix insulation layer ONS may extend to the peripheral area PRA.

The buffer layer BF may be disposed on the second encapsulation inorganic layer IOL2 and the black matrix insulation layer ONS. The buffer layer BF may be disposed in the central area CTA and the peripheral area PRA.

The first touch electrode layer TE1 may include a first upper touch electrode layer TEU1 and a first lower touch electrode layer TEL1. The first upper touch electrode layer TEU1 may be disposed on the first lower touch electrode layer TEL1.

The second touch electrode layer TE2 may include a second upper touch electrode layer TEU2 and a second lower touch electrode layer TEL2. The second upper touch electrode layer TEU2 may be disposed on the second lower touch electrode layer TEL2.

The first lower touch electrode layer TEL1 and the second lower touch electrode layer TEL2 may be disposed on the buffer layer BF.

A first contact insulation layer ITN may be disposed between the first lower touch electrode layer TEL1 and the first touch electrode layer TEU1. The first contact insulation layer ITN may be disposed in the central area CTA and may not overlap the peripheral area PRA. The first contact insulation layer ITN may be formed from an inorganic material.

A second contact insulation layer OTN may be disposed between the second lower touch electrode layer TEL2 and the second upper touch electrode layer TEU2. The second contact insulation layer OTN may be disposed in the peripheral area PRA and may not overlap the central area CTA. The second contact insulation layer OTN may be formed from an organic material.

The first contact insulation layer ITN and the second contact insulation layer OTN form together the contact insulation layer TN that has been described in relation to FIG. 7. In an embodiment, a material forming the first contact insulation layer ITN and a material forming the second contact insulation layer OTN may be different, and the thicknesses thereof may be controlled differently. Thus, a position at which the second black matrix BM2 is disposed may be precisely controlled in a direction perpendicular to the base layer SUB.

In some implementations, any one of the first contact insulation layer ITN and the second contact insulation layer OTN may be omitted. When the first contact insulation layer ITN is omitted, the second insulation layer OTN may be formed to overlap all the central area CTA and the peripheral area PRA, and may be disposed between the first lower touch electrode layer TEL1 and the first upper touch electrode layer TEU1 and between the second lower touch electrode layer TEL2 and the second upper touch electrode layer TEU2. Similarly, when the second contact insulation layer OTN is omitted, the first contact insulation layer ITN may be formed to overlap all of the central area CTA and the peripheral area PRA, and may be disposed between the first lower touch electrode layer TEL1 and the first upper touch electrode layer TEU1 and between the second lower touch electrode layer TEL2 and the second upper touch electrode layer TEU2. The position at which the second black matrix BM2 is disposed may be controlled using one remaining layer between the first contact insulation layer ITN and the second contact insulation layer OTN in a direction perpendicular to the base area SUB.

A first planarized layer PVX may be disposed on the first upper touch electrode layer TEU1 and the second upper touch electrode layer TEU2. The first planarized layer PVX may be formed from an organic material to provide a planarized surface thereon. The first planarized layer PVX may be disposed in the central area CTA and the peripheral area PRA.

The second black matrix BM2 may be disposed on the first planarized layer PVX.

A second planarized layer OC may be disposed over the first planarized layer PVX and the second black matrix BM2. The first planarized layer PVX and the second planarized layer OC may contact the second black matrix BM2. The second planarized layer OC may be disposed in the central area CTA and the peripheral area PRA.

Figure 13:
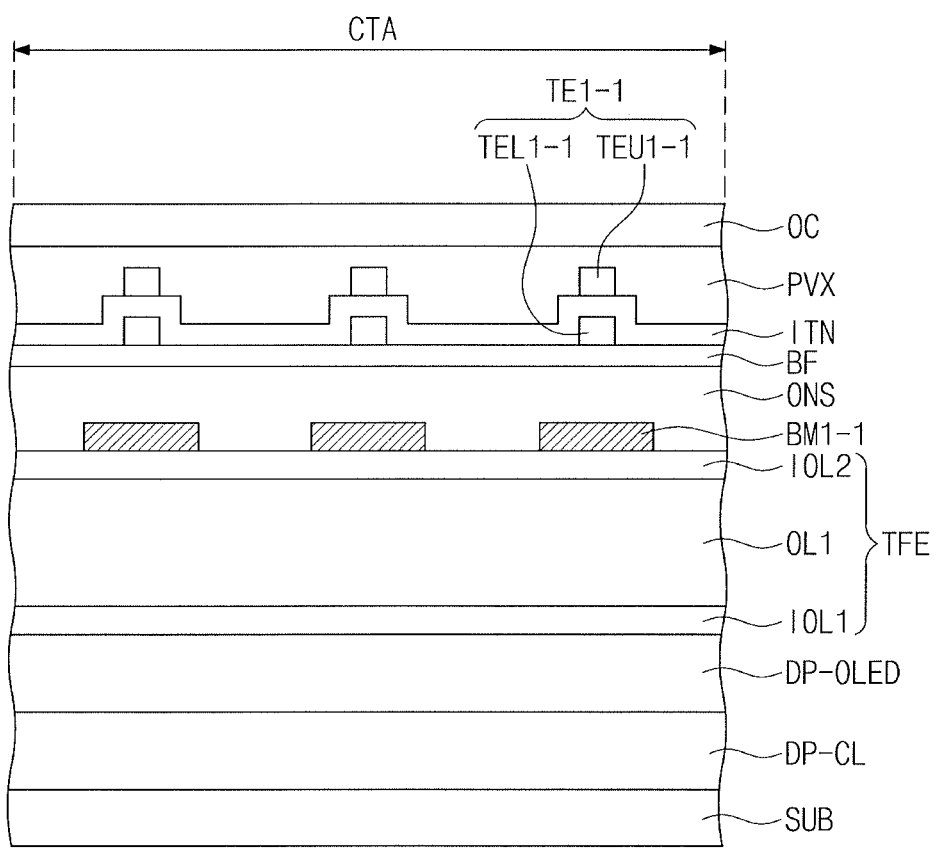
FIG. 13 illustrates a cross-sectional view of a display module corresponding to a central area of FIG. 8 in another embodiment.
Figure 14:
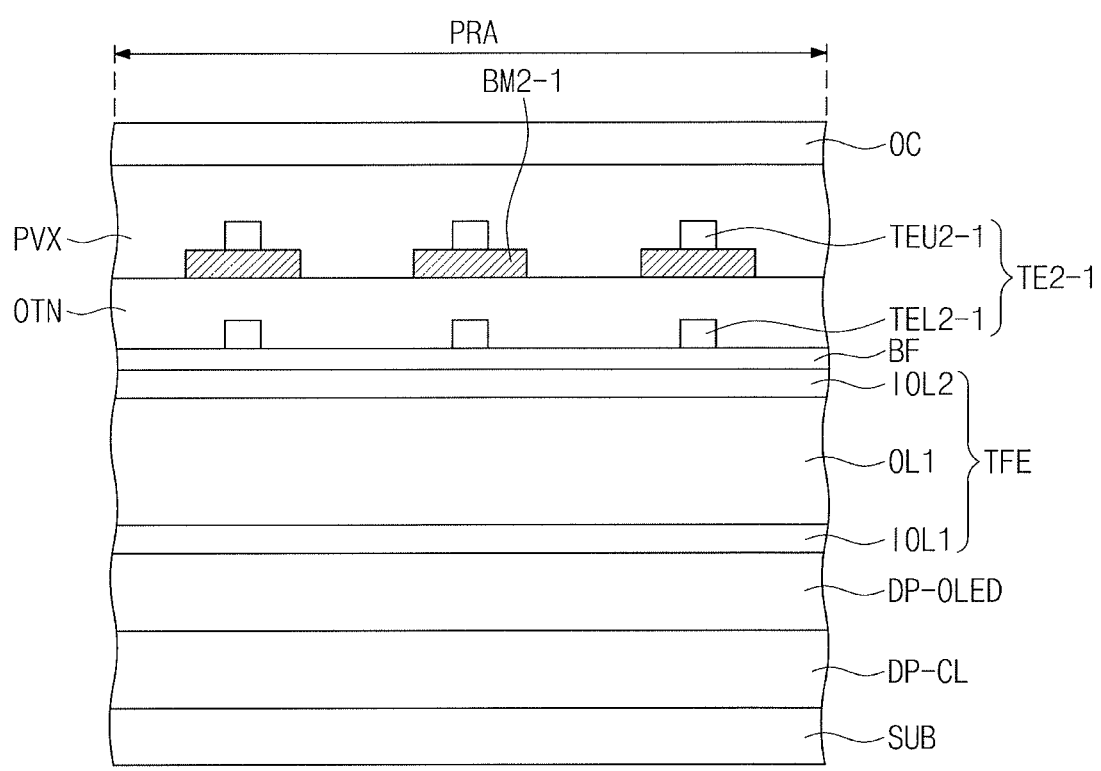
FIG. 14 illustrates a cross-sectional view of a display module corresponding to a peripheral area of FIG. 8 in another embodiment.

FIG. 13 illustrates a cross-sectional view of the display module corresponding to the central area of FIG. 8 in an embodiment, and FIG. 14 illustrates a cross-sectional view of the display module corresponding to the peripheral area of FIG. 8 in another embodiment.

Referring to FIG. 13, a first black matrix BM1-1 and a first touch metal layer TE1-1 may be disposed in the central area CTA. The first touch metal layer TE1-1 may include a first upper touch metal layer TEU-1 and a first lower touch metal layer TEL1-1.

In an embodiment, the central area CTA illustrated in FIG. 13 may have a substantially identical structure to the central area CTA of the embodiment that has been described in relation to FIG. 11. Accordingly, a detailed description about FIG. 13 will not be repeated and will follows the description of FIG. 11.

Referring to FIG. 14, a second black matrix BM2-1 and a second touch metal layer TE2-1 may be disposed in the peripheral area PRA. The second touch metal layer TE2-1 may include a second upper touch metal layer TEU2-1 and a second lower touch metal layer TEL2-1.

In an embodiment, in comparison with the peripheral area PRA of the embodiment, which has been described in relation to FIG. 12, the peripheral area PRA illustrated in FIG. 14 may differ with respect to positions of the second black matrix BM2-1 and the second upper touch metal layer TEU2-1, and may be substantially identical thereto in remaining areas. Accordingly, differences between the peripheral area PRA of FIG. 14 and that of FIG. 12 will mainly be described, and a description regarding substantially identical configurations will not be repeated.

The second black matrix BM2-1 may be disposed on the second contact insulation layer OTN. The second black matrix BM2-1 may contact the second contact insulation layer OTN. The second black matrix BM2-1 may be disposed between the second lower touch electrode layer TEL2-1 and the second upper touch electrode layer TEU2-1.

The second upper touch electrode layer TEU2-1 may be disposed on the second black matrix BM2-1 and may contact the second black matrix BM2-1.

The first planarized layer PVX may be disposed on the first upper touch electrode layer TEU1 and the second upper touch electrode layer TEU2. The first planarized layer PVX may contact the second black matrix BM2-1.

In the embodiment having been described in relation to FIGS. 13 and 14, the second black matrix BM2-1 may be disposed on an upper layer higher than that of the first black matrix BM1-1. When considering a difference in thickness of the first encapsulation layer OL1 in the central area CTA and in the peripheral area PRA, the first and second black matrixes BM1-1 and BM2-1 may be disposed at the substantially same position in a direction perpendicular to the base layer SUB.

Figure 15:
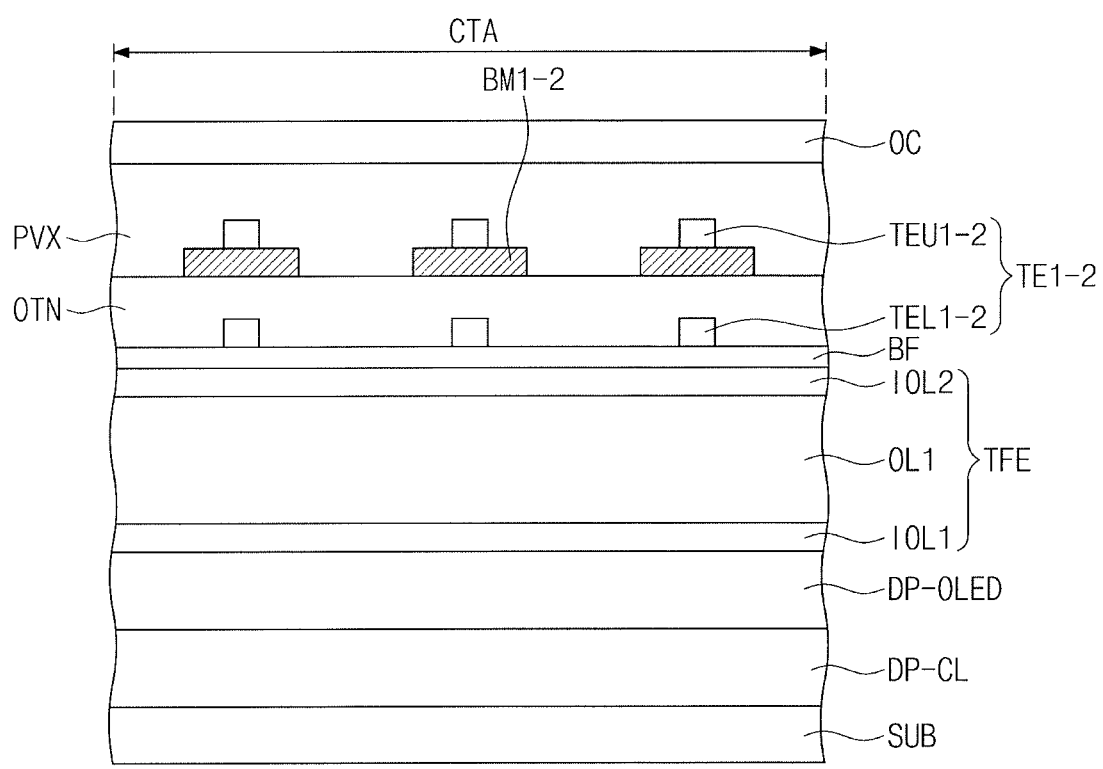
FIG. 15 illustrates a cross-sectional view of a display module corresponding to the peripheral area of FIG. 8 in another embodiment.
Figure 16:
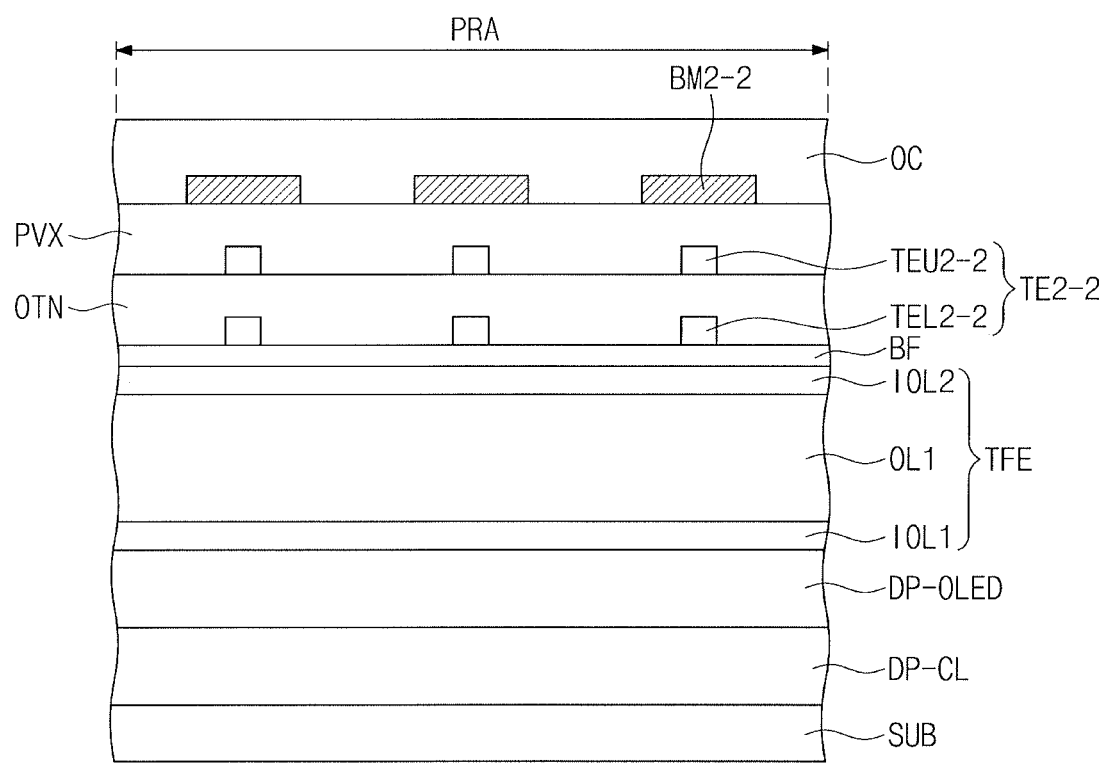
FIG. 16 illustrates a cross-sectional view of a display module corresponding to the peripheral area of FIG. 8 in another embodiment.

FIG. 15 illustrates a cross-sectional view of the display module corresponding to the central area of FIG. 8 according to an embodiment, and FIG. 16 illustrates a cross-sectional view of a display module corresponding to the peripheral area of FIG. 8 according to an embodiment.

Referring to FIG. 15, a first black matrix BM1-2 and a first touch metal layer TE1-2 may be disposed in the central area CTA. The first touch metal layer TE1-2 may include a first upper touch metal layer TEU-2 and a first lower touch metal layer TEL1-2.

The central area CTA illustrated in FIG. 15 may have a substantially similar structure to the peripheral area PRA of the embodiment that has been described in relation to FIG. 14. The first black matrix BM1-2 of FIG. 15 may be disposed on the same layer as the second black matrix BM2-1 of FIG. 14. The first upper touch metal layer TEU1-2 and the first upper touch metal layer TEL1-2 of FIG. 15 may be respectively disposed on the same layers as the second upper touch metal layer TEU2-1 and the second lower touch metal layer TEL2-1.

Referring to FIG. 16, a second black matrix BM2-2 and a second touch metal layer TE2-2 may be disposed in the peripheral area PRA. The second touch metal layer TE2-2 may include a second upper touch metal layer TEU2-2 and a second lower touch metal layer TEL2-2.

The peripheral area PRA illustrated in FIG. 16 may have a substantially similar structure to that of the embodiment described in relation to FIG. 12. The second black matrix BM2-2 of FIG. 16 may be disposed on the same layer as that of the second black matrix BM2 of FIG. 12. The second upper touch metal layer TEU2-2 and the second lower touch metal layer TEL2-2 of FIG. 16 may be respectively disposed on the same layers as the second upper touch metal layer TEU2 and the second lower touch metal layer TEL2 of FIG. 12.

In the embodiments described in relation to FIGS. 15 and 16, the second black matrix BM2-2 may be disposed on an upper layer higher than that of the first black matrix BM1-2. When considering a difference in thickness of the first encapsulation layer OL1 in the central area CTA and the peripheral area PRA, the first and second black matrixes BM1-2 and BM2-2 may be disposed at the substantially same position in a direction perpendicular to the base layer SUB.

Figure 17:
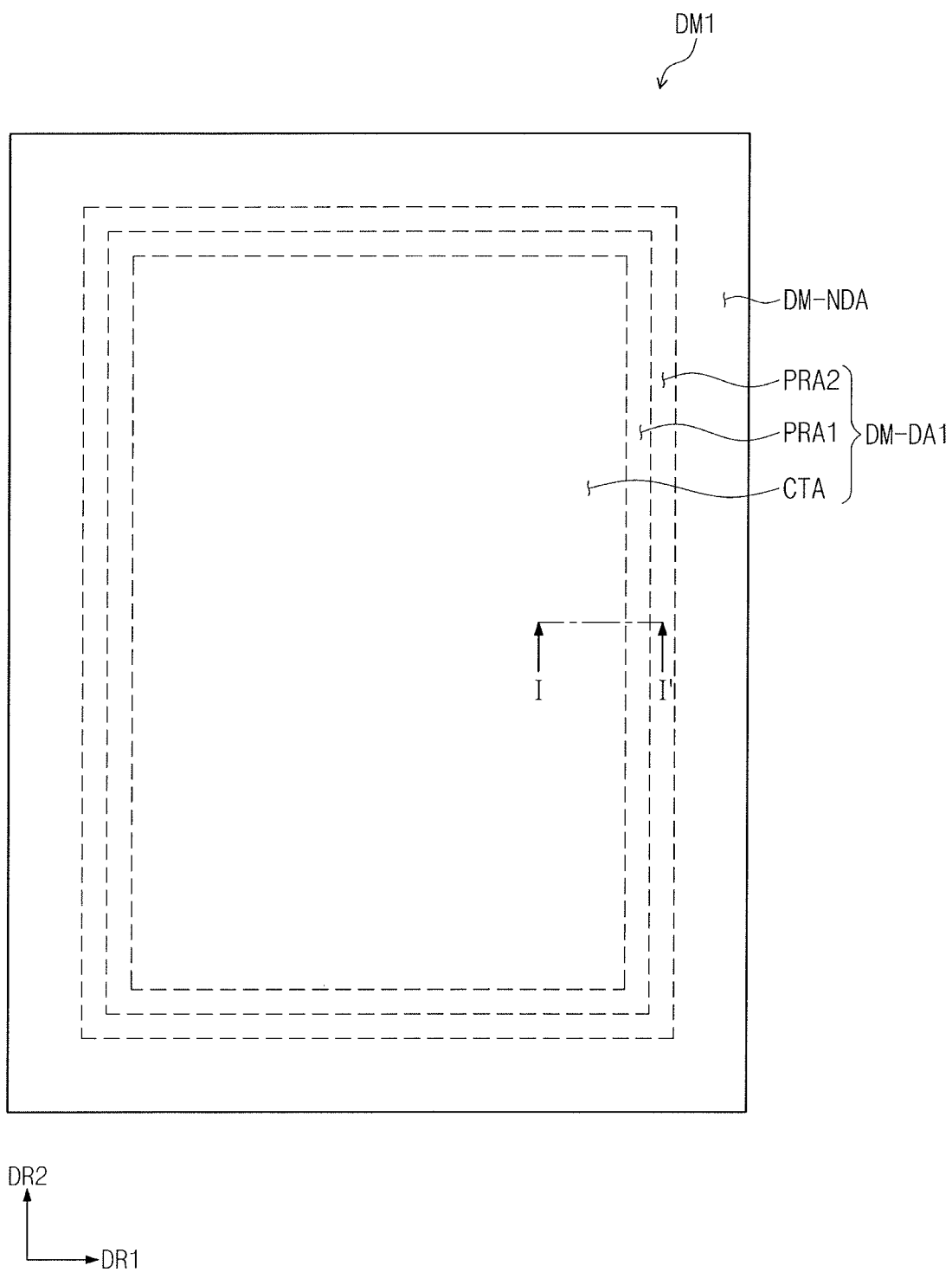
FIG. 17 illustrates a plan view illustrating a display module according to another embodiment.
Figure 18:
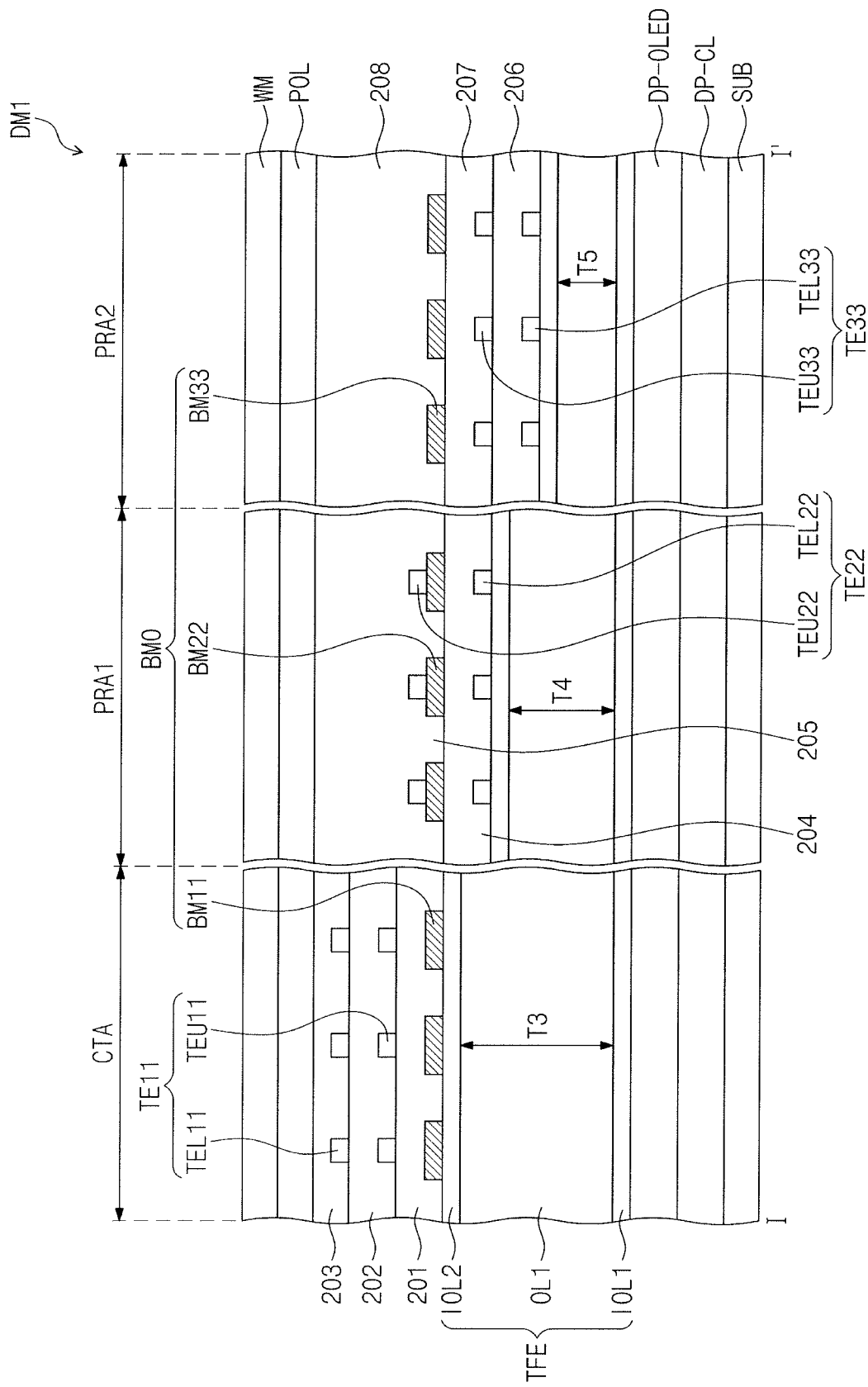
FIG. 18 illustrates a cross-sectional view cut along a line I-I' of FIG. 17.

FIG. 17 illustrates a plan view depicting a display module according to an embodiment, and FIG. 18 illustrates a cross-sectional view cut along line I-I' of FIG. 17.

In the display module DM1 illustrated in FIGS. 17 and 18, the peripheral area PRA includes a first peripheral area PRA1 and a second peripheral area PRA2. The structures of the first peripheral area PRA1 and the second peripheral area PRA2 are different from each other in comparison with the display module DM that has been described in relation to FIGS. 8 to 10.

Referring to FIGS. 17 and 18, a display area DM-DA1 and a non-display area DM-NDA may be defined in the display module DM1. The central area CTA and the peripheral area PRA may be defined in the display area DM-DA1. The peripheral area PRA may be defined in the periphery of the central area CTA. The peripheral area PRA may include a first peripheral area PRA1 and a second peripheral area PRA2. The second peripheral area PRA2 may be defined as being in the periphery of the first peripheral area PRA1.

In an embodiment, it is illustrated that the peripheral area PRA on the plane encloses the central area CTA, and the second peripheral area PRA2 encloses the first peripheral area PRA1. In some implementations, the peripheral area PRA may not enclose the central area CTA, but may be defined in the periphery of the central area CTA. In addition, the second peripheral area PRA2 may be defined in the periphery of the first peripheral area PRA1.

The first encapsulation organic layer OL1 may have a third thickness T3 in the central area CTA. The first encapsulation organic layer OL1 may have a fourth thickness T4, which is smaller than the third thickness 13, in the first peripheral area PRA1. The first encapsulation organic layer OL1 may have a fifth thickness 15, which is smaller than the fourth thickness T4, in the second peripheral area PRA2. The thickness of the first encapsulation layer OL1 in the peripheral area PRA may not be constant but be different according to the position. The average thickness of the first encapsulation organic layer OL1 in the first peripheral area PRA1 may be the second thickness T2.

The black matrix BMO may include a first black matrix BM1, a second black matrix BM2, and a third black matrix BM3. The black matrix BMO may improve a color sense of a displayed image and may absorb external light to prevent reflection in the periphery.

The first black matrix BM1 may be disposed in the central area CTA, the second black BM2 in the first peripheral area PRA1, and the third black matrix BM3 in the second peripheral area PRA2. A description of a material forming the black matrices BM1, BM2, and BM3 will be follow the description in relation to FIG. 9.

The touch electrode layer TML may include may include a first touch electrode layer TE11, a second touch electrode layer TE22 and a third touch electrode layer TE33.

The first touch electrode layer TE11 may be disposed in the central area CTA. The first touch electrode layer TE11 may include a first lower touch electrode layer TEL11 and a first upper touch electrode layer TEU11. The first upper touch electrode layer TEU11 may be disposed on the first lower touch electrode layer TEL11.

The second touch electrode layer TE22 may be disposed in the first peripheral area PRA1. The second touch electrode layer TE22 may include a second lower touch electrode layer TEL22 and a second upper touch electrode layer TEU22. The second upper touch electrode layer TEU22 may be disposed on the second lower touch electrode layer TEL22.

The third touch electrode layer TE33 may be disposed in the second peripheral area PRA2. The third touch electrode layer TE33 may include a third lower touch electrode layer TEL33 and a third upper touch electrode layer TEU33. The third upper touch electrode layer TEU33 may be disposed on the third lower touch electrode layer TEL33.

The first black matrix BM11 may be disposed under the first lower touch electrode layer TEL11 and the first upper touch electrode layer TEU11. The second black matrix BM22 may be disposed between the second lower touch electrode layer TEL22 and the second upper touch electrode layer TEU22. The second black matrix BM22 may contact the second upper touch electrode layer TEU22. The third black matrix BM33 may be disposed on the third lower touch electrode layer TEL33 and the third upper touch electrode layer TEU33.

The display module DM may include first to eighth insulation layers 201 to 208.

The first to third insulation layers 201 to 203 may be disposed in the central area CTA. The first insulation layer 201 may be disposed over the first black matrix BM11 to cover the first black matrix BM11 in the central area CTA. The second insulation layer 202 may be disposed between the first lower touch electrode layer TEL11 and the first upper touch electrode layer TEU11.

The fourth and fifth insulation layers 204 and 205 may be disposed in the peripheral area PRA1. The fourth insulation layer 204 may be disposed between the second lower touch electrode layer TEL22 and the second black matrix BM22. The fifth insulation layer 205 is disposed on the second black matrix BM22 and on the second upper touch electrode layer TEU22.

The sixth to eighth insulation layers 206 to 208 may be disposed in the second peripheral area PRA2. The sixth insulation layer 206 may be disposed between the third lower touch electrode layer TEL33 and the third upper touch electrode layer TEU33. The seventh insulation layer 207 may be disposed between the third upper touch electrode layer TEU33 and the third black matrix BM33. The eighth insulation layer 208 may be disposed on the third black matrix BM33.

Each of the first to eighth insulation layers 201 to 208 maybe in a form of an organic single layer, an inorganic single layer, or a multi-layered structure including an organic layer and inorganic layer. At least a part of the first to eighth insulation layers 201 to 208 may have different layered structures.

According to the display module DM-1 having been described in relation to FIGS. 17 and 18, positions of the first to third black matrices BM11, BM22, and BM33 in the central area CTA, the first peripheral area PRA1, and the second peripheral area PRA2 may be set to be different from each other. Thus, the first to third black matrices BM11, BM22, and BM33 may be disposed at substantially similar positions in the direction perpendicular to the base layer SUB.

By way of summation and review, an organic light emitting display panel may have different optical characteristics according to a position within a display area. Such different optical characteristics may cause a degradation of display quality.

Embodiments provide a display apparatus configured to enhance the display quality of a display module by compensating for the difference in optical characteristics of the display module caused by the difference in thickness of a first encapsulation organic layer in central and peripheral areas. A difference in optical characteristics of the display module caused by a difference in thickness of the first encapsulation organic layer in the central and peripheral areas may be compensated for by changing positions of a black matrix and a touch electrode layer. Accordingly, display quality of the display module may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
a display panel having a display area to display an image and a non-display area adjacent to the display area, and in which a central area and a peripheral area in a periphery of the central area are defined in the display area;
a touch sensor on the display panel, the touch sensor including a touch electrode layer; and
a black matrix on the display panel,
wherein the black matrix includes a first black matrix in the central area and a second black matrix in the peripheral area,
the second black matrix is on a layer of the display panel that is higher than the first black matrix, and
wherein none of the black matrices overlap in a plan view on an entirety of the display panel.

2. The display apparatus as claimed in claim 1, wherein:
the touch electrode layer includes a first touch electrode layer in the central area and a second touch electrode layer in the peripheral area,
the first black matrix is under the first touch electrode layer, and
the second black matrix is over the second touch electrode layer.

3. The display apparatus as claimed in claim 1, wherein:
the touch electrode layer includes a first touch electrode layer in the central area and a second touch electrode layer in the peripheral area,
the first touch electrode layer includes a first lower touch electrode layer and a first upper touch electrode layer on the first lower touch electrode layer, and
the second touch electrode layer includes a second lower touch electrode layer and a second upper touch electrode layer on the second lower touch electrode layer.

4. The display apparatus as claimed in claim 3, wherein:
the first black matrix is under the first lower touch electrode layer and the first upper touch electrode layer, and
the second black matrix is over the second lower touch electrode layer and the second upper touch electrode layer.

5. The display apparatus as claimed in claim 3, wherein:
the first black matrix is under the first lower touch electrode layer and the first upper touch electrode layer, and
the second black matrix is between the second lower touch electrode layer and the second upper touch electrode layer.

6. The display apparatus as claimed in claim 3, wherein:
the first black matrix is between the first lower touch electrode layer and the first upper touch electrode layer, and
the second black matrix is over the second lower touch electrode layer and the second upper touch electrode layer.

7. The display apparatus as claimed in claim 1, further comprising:
a polarization layer over the touch sensor and the black matrix.

8. The display apparatus as claimed in claim 1, wherein the display panel includes:
a base layer;
a plurality of display elements on the base layer and in the display area, the plurality of display elements to display the image; and
an encapsulation layer that encapsulates the plurality of display elements.

9. The display apparatus as claimed in claim 8, wherein:
the black matrix overlaps an area between the plurality of display elements.

10. The display apparatus as claimed in claim 8, wherein:
the encapsulation layer includes an encapsulation organic layer that covers the display area, and
the encapsulation organic layer has a first thickness in the central area and a second thickness thinner than the first thickness in the peripheral area.

11. The display apparatus as claimed in claim 10, wherein the encapsulation organic layer includes an acryl-based monomer.

12. The display apparatus as claimed in claim 1, wherein the peripheral area is on a plane and encloses the central area.

13. The display apparatus as claimed in claim 1, wherein:
the peripheral area includes a first peripheral area and a second peripheral area in a periphery of the first peripheral area,
the black matrix further includes a third black matrix in the second peripheral area,
the second black matrix is in the first peripheral area, and
the third black matrix is on a layer that is higher than the second black matrix.

14. The display apparatus as claimed in claim 13, wherein:
the touch electrode layer includes a first touch electrode layer in the central area, a second touch electrode layer in the first peripheral area, and a third touch electrode layer in the second peripheral area,
the first touch electrode layer includes a first lower touch electrode layer and a first upper touch electrode layer on the first lower touch electrode layer,
the second touch electrode layer includes a second lower touch electrode layer and a second upper touch electrode layer on the second lower touch electrode layer, and
the third touch electrode layer includes a third lower touch electrode layer and a third upper touch electrode layer on the third lower touch electrode layer.

15. The display apparatus as claimed in claim 14, wherein:
the first black matrix is under the first lower touch electrode layer and the first upper touch electrode layer,
the second black matrix is between the second lower touch electrode layer and the second upper touch electrode layer, and
the third black matrix is over the third lower touch electrode layer and the third upper touch electrode layer.

16. A display apparatus, comprising:
a display panel having a display area to display an image and a non-display area adjacent to the display area, wherein a central area and a peripheral area in a periphery of the central area are defined in the display area;
a touch sensor on the display panel, the touch sensor including a touch electrode layer; and
a black matrix on the display panel,
wherein the black matrix includes a first black matrix in the central area and a second black matrix in the peripheral area,
the touch electrode layer includes a first touch electrode layer in the central area and a second touch electrode layer in the peripheral area,
wherein the first black matrix is under the first touch electrode layer, and the second black matrix is over the second touch electrode layer, and
wherein none of the black matrices overlap in a plan view on an entirety of the display panel.

17. The display apparatus as claimed in claim 16, wherein the display panel includes:
a base layer;
a display element on the base layer and in the display area, the display element to display the image; and
an encapsulation layer including an encapsulation organic layer that encapsulates the display element and covers the display area,
wherein the encapsulation organic layer has a first thickness in the central area, and a second thickness smaller than the first thickness in the peripheral area.

18. A display apparatus, comprising:
a display panel having a display area to display an image and a non-display area adjacent to the display area, and in which a central area and a peripheral area in a periphery of the central area are defined in the display area;
a touch sensor on the display panel, the touch sensor including a touch electrode layer; and
a black matrix on the display panel,
wherein:
the touch electrode layer includes a first touch electrode layer in the central area and a second touch electrode layer in the peripheral area,
the first touch electrode layer is on layer that is higher than the second touch electrode layer, and
wherein none of the touch electrode layers overlap in a plan view on an entirety of the display panel.

19. The display apparatus as claimed in claim 18, wherein:
- the first touch electrode layer includes a first lower touch electrode layer and a first upper touch electrode layer on the first lower touch electrode layer,
- the second touch electrode layer includes a second lower touch electrode layer and a second upper touch electrode layer on the second lower touch electrode layer, and
- the first lower touch electrode layer is on an upper layer than that of the second lower touch electrode layer.

20. The display apparatus as claimed in claim 19, wherein:
- the black matrix includes a first black matrix in the central area and a second black matrix in the peripheral area, and
- the first lower touch electrode layer is over the first black matrix, and the second touch electrode layer is under the second black matrix.

\* \* \* \* \*